United States Patent
Heo et al.

(10) Patent No.: US 10,529,877 B2
(45) Date of Patent: Jan. 7, 2020

(54) SEMICONDUCTOR DEVICES INCLUDING TWO-DIMENSIONAL MATERIALS AND METHODS OF MANUFACTURING THE SEMICONDUCTOR DEVICES

(71) Applicants: Samsung Electronics Co., Ltd., Suwon-si, Gyeonggi-do (KR); Research & Business Foundation Sungkyunkwan University, Suwon-si, Gyeonggi-do (KR)

(72) Inventors: Jinseong Heo, Seoul (KR); Kiyoung Lee, Seoul (KR); Seongjun Park, Seoul (KR); Yongseon Shin, Suwon-si (KR); Woojong Yu, Suwon-si (KR)

(73) Assignees: Samsung Electronics Co., Ltd., Gyeonggi-do (KR); Research & Business Foundation Sungkyunkwan University, Gyeonggi-do (KR)

(*) Notice: Subject to any disclaimer, the term of this patent is extended or adjusted under 35 U.S.C. 154(b) by 0 days.

(21) Appl. No.: 15/825,388

(22) Filed: Nov. 29, 2017

(65) Prior Publication Data
US 2018/0151763 A1    May 31, 2018

(30) Foreign Application Priority Data
Nov. 30, 2016 (KR) .................. 10-2016-0162293

(51) Int. Cl.
*H01L 29/06* (2006.01)
*H01L 31/032* (2006.01)
(Continued)

(52) U.S. Cl.
CPC .......... *H01L 31/0324* (2013.01); *H01L 29/04* (2013.01); *H01L 29/0665* (2013.01);
(Continued)

(58) Field of Classification Search
CPC ............. H01L 31/0324; H01L 29/0665; H01L 29/66015; H01L 29/66969
See application file for complete search history.

(56) References Cited

U.S. PATENT DOCUMENTS

| 9,409,792 B2 | 8/2016 | Zhang et al. |
| 2015/0122315 A1* | 5/2015 | Shin ..................... H01L 29/73 136/255 |

(Continued)

FOREIGN PATENT DOCUMENTS

| JP | 2016/088840 A | 5/2016 |
| KR | 101478627 B1 | 1/2015 |
| KR | 2015/0114006 A | 10/2015 |

*Primary Examiner* — Douglas M Menz
(74) *Attorney, Agent, or Firm* — Harness, Dickey & Pierce, P.L.C.

(57) ABSTRACT

Semiconductor devices including two-dimensional (2D) materials and methods of manufacturing the semiconductor devices are provided. A semiconductor device may include a semiconductor layer including layers of a 2D material, and an intercalation material between the layers of the 2D material. The semiconductor device may further include a first conductive layer on a first surface of the semiconductor layer and a second conductive layer on a second surface of the semiconductor layer that is opposite the first surface. A portion of the 2D material may have a first crystalline structure, and another portion of the 2D material may have a second crystalline structure that is different from the first crystalline structure. The 2D material may include a metal chalcogenide-based material.

24 Claims, 17 Drawing Sheets

(51) Int. Cl.

*H01L 29/66* (2006.01)
*H01L 29/423* (2006.01)
*H01L 29/78* (2006.01)
*H01L 29/786* (2006.01)
*H01L 29/04* (2006.01)
*H01L 29/24* (2006.01)
*H01L 29/41* (2006.01)

(52) U.S. Cl.

CPC ............ *H01L 29/24* (2013.01); *H01L 29/413* (2013.01); *H01L 29/42372* (2013.01); *H01L 29/66015* (2013.01); *H01L 29/66969* (2013.01); *H01L 29/7827* (2013.01); *H01L 29/78642* (2013.01); *H01L 29/42356* (2013.01)

(56) References Cited

U.S. PATENT DOCUMENTS

2016/0343891 A1  11/2016  Heo et al.
2016/0359062 A1  12/2016  Heo et al.

\* cited by examiner

SEMICONDUCTOR DEVICES INCLUDING TWO-DIMENSIONAL MATERIALS AND METHODS OF MANUFACTURING THE SEMICONDUCTOR DEVICES

CROSS-REFERENCE TO RELATED APPLICATION

This application claims priority under 35 U.S.C. § 119 to Korean Patent Application No. 10-2016-0162293, filed on Nov. 30, 2016, in the Korean Intellectual Property Office, the disclosure of which is incorporated herein in its entirety by reference.

BACKGROUND

1. Field

The present disclosure relates to semiconductor devices and methods of manufacturing the same, and more particularly, to semiconductor devices including two-dimensional (2D) materials and methods of manufacturing the semiconductor devices.

2. Description of Related Art

A two-dimensional (2D) material is typically a single-layer or half-layer solid material in which atoms form a crystal structure. A well-known example of a 2D material is graphene. Graphene is a single-layer (single atomic layer) structure in which carbon atoms form a hexagonal structure. Graphene may have a band structure that is symmetrical around the Dirac point, and the effective mass of a charge at the Dirac point is substantially small. Therefore, graphene may have a charge mobility that is at least 10 times or higher (may be even 1000 times or more) the charge mobility of silicon (Si). Furthermore, graphene may have a high Fermi velocity (VF). Therefore, graphene has drawn attention as a next-generation material that may overcome limitations of materials in the related art.

Research and development into various 2D materials having semiconductor or insulator characteristics, starting from research into graphene, has been conducted. Recently, a research area has expanded into technology of stacking different 2D materials. However, to apply a 2D material to actual devices, an interface issue between 2D materials or between a 2D material and another material needs to be addressed. When a 2D material is applied to semiconductor devices, various technical problems may occur, and it may be difficult to secure good properties/performance.

SUMMARY

Provided are high-performance semiconductor devices (e.g., optoelectronic devices or transistors) including a two-dimensional (2D) material.

Provided are semiconductor devices capable of addressing an interface issue between 2D materials or between a 2D material and another material.

Provided are semiconductor devices capable of increasing carrier mobility and lowering contact resistance.

Provided are semiconductor devices having a vertical-type structure having good performance and good operation characteristics.

Provided are methods of manufacturing the semiconductor devices (e.g., optoelectronic devices or transistors).

Additional aspects will be set forth in part in the description which follows and, in part, will be apparent from the description, or may be learned by practice of the presented embodiments.

According to some example embodiments, a semiconductor device includes a semiconductor layer including layers of a two-dimensional (2D) material, and an intercalation material between the layers of the 2D material; a first conductive layer on a first surface of the semiconductor layer; and a second conductive layer on a second surface of the semiconductor layer. The second surface is opposite the first surface.

In some example embodiments, the 2D material may include a metal chalcogenide-based material.

In some example embodiments, the 2D material may include a transition metal dichalcogenide (TMD) material.

In some example embodiments, a portion of the 2D material may include a first crystalline structure, and another portion of the 2D material may include a second crystalline structure that is different from the first crystalline structure.

In some example embodiments, the first crystalline structure may include a 2H phase, and the second crystalline structure may include at least one of a 1T phase and a 1T' phase.

In some example embodiments, a region having the second crystalline structure within the 2D material may have a higher electric conductivity than a region having the first crystalline structure within the 2D material.

In some example embodiments, the intercalation material may include at least one of lithium (Li) and potassium (K).

In some example embodiments, the at least one of the first and second conductive layers may include one of metal, metal compound, and graphene.

In some example embodiments, the first and second conductive layers may include metal or metal compound, or the first and second conductive layers may include graphene, or one of the first and second conductive layers may include metal or metal compound and an other of the first and second conductive layers includes graphene.

In some example embodiments, the semiconductor layer may have a thickness of 1 nm to several hundreds of μm.

In some example embodiments, the semiconductor layer may have a width of several nm to several hundreds of μm.

In some example embodiments, the semiconductor layer may be an undoped layer or the semiconductor layer may include one of a p-type and an n-type dopant.

In some example embodiments, the semiconductor device may further include a gate electrode apart from the semiconductor layer; and a gate insulation layer between the semiconductor layer and the gate electrode.

In some example embodiments, the gate insulation layer may be on a surface of the gate electrode, and the first conductive layer, the semiconductor layer, and the second conductive layer may be sequentially stacked on a surface of the gate insulation layer.

In some example embodiments, the semiconductor device may be a transistor.

In some example embodiments, the semiconductor device may be an optoelectronic device.

According to some example embodiments, a method of manufacturing a semiconductor device including first and second conductive layers respectively connected to opposite surfaces of a semiconductor layer is provided. The method includes providing a device unit including a semiconductor layer and processing the device unit with a solution including an intercalation material. The semiconductor layer includes layers of a 2D material. The processing the device unit includes inserting the intercalation material between the layers of the 2D material.

In some example embodiments, the providing of the device unit may include forming the first conductive layer, forming the semiconductor layer on the first conductive layer, and forming the second conductive layer on the semiconductor layer.

In some example embodiments, the solution may include at least one of n-butyllithium, tert-butyllithium, methyllithium, and a potassium hexafluorophosphate solution.

In some example embodiments, the 2D material may have a first crystalline structure before the intercalation material is inserted between the layers of the 2D material. The inserting the intercalation material between the layers of the 2D material may include changing a crystalline structure of a portion of the 2D material to a second crystalline structure.

In some example embodiments, the first crystalline structure may include a 2H phase, and the second crystalline structure may include at least one of a 1T phase and a 1T' phase.

In some example embodiments, the 2D material may include a transition metal dichalcogenide (TMD) material.

In some example embodiments, at least one of the first and second conductive layers may include one of metal, metal compound, and graphene.

In some example embodiments, the method may further include forming a gate electrode spaced apart from the semiconductor layer.

BRIEF DESCRIPTION OF THE DRAWINGS

These and/or other aspects will become apparent and more readily appreciated from the following description of the non-limiting embodiments, taken in conjunction with the accompanying drawings in which.

DETAILED DESCRIPTION

Figure 1:
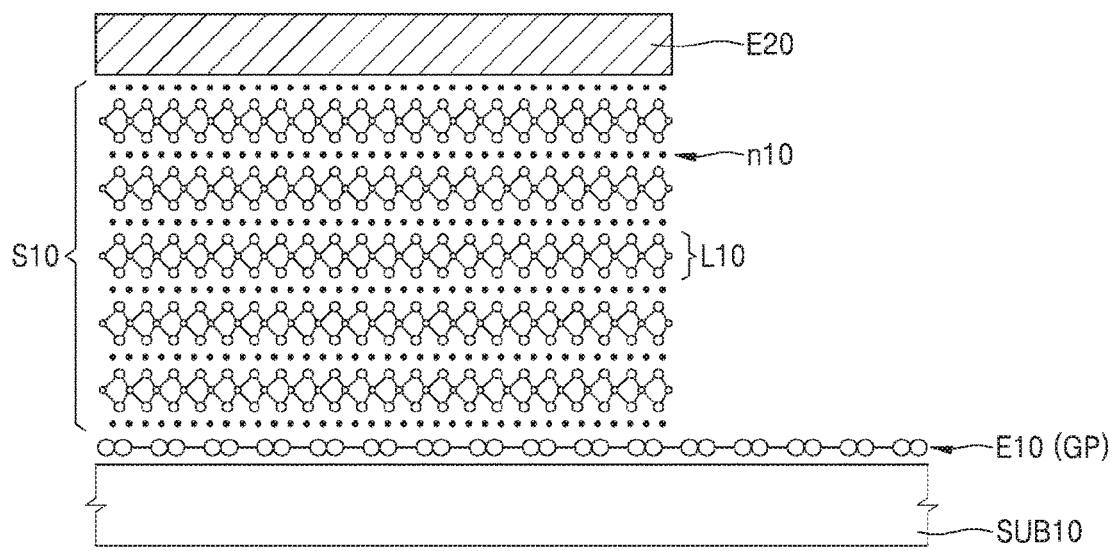
FIG. 1 is a cross-sectional view of a semiconductor device including a two-dimensional (2D) material, according to some example embodiments.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, semiconductor devices including two-dimensional (2D) materials, and methods of manufacturing the semiconductor devices, according to example embodiments, will be described more fully with reference to the accompanying drawings. In the drawings, the widths and thicknesses of layers and regions are exaggerated for clarity of the specification and convenience of explanation. Like reference numerals in the drawings denote like elements.

FIG. 1 is a cross-sectional view of a semiconductor device including a two-dimensional (2D) material, according to some example embodiments.

Referring to FIG. 1, a semiconductor layer S10 including a 2D material may be disposed on a substrate SUB10. The 2D material is a single-layer or half-layer solid in which atoms form a certain crystalline structure. The 2D material may have a layered structure. The semiconductor layer S10 may include a single-layer structure (single layer or unit layer) L10 having a 2D crystalline structure. The semiconductor layer S10 may have a stack of a plurality of single-layer structures L10. FIG. 1 illustrates a case where a plurality of single-layer structures L10 are stacked. The semiconductor layer S10 may further include an intercalation material n10 between layers of the 2D material. A structure of the semiconductor layer S10 will be described later in detail.

The semiconductor device may include a first conductive layer E10 disposed on a first surface of the semiconductor layer S10, and may further include a second conductive layer E20 disposed on a second surface of the semiconductor layer S10 that faces the first surface of the semiconductor layer S10. For example, the first conductive layer E10 may be disposed on a lower surface of the semiconductor layer S10, and the second conductive layer E20 may be disposed on an upper surface of the semiconductor layer S10. Accordingly, the first conductive layer E10 may be between the substrate SUB10 and the semiconductor layer S10, and the semiconductor layer S10 may be between the first conductive layer E10 and the second conductive layer E20. As such, when the first conductive layer E10 and the second conductive layer E20 may be respectively on the first surface and the second surface of the semiconductor layer S10, which are opposite to each other, the semiconductor device may be considered to have a vertically stacked structure. In other words, the semiconductor device may be a vertical-type device.

A current may flow in a thickness direction of the semiconductor layer S10, namely, in a direction perpendicular to the semiconductor layer S10. A current may flow between the first conductive layer E10 and the second conductive layer E20 via the semiconductor layer S10. The first conductive layer E10 may be referred to as a first electrode and the second conductive layer E20 may be referred to as a second electrode. At least one of the first and second conductive layers E10 and E20 may include at least one of metal, metal compound, and graphene.

In FIG. 1, the first conductive layer E10 includes graphene GP, and the second conductive layer E20 includes a metallic material (namely, metal or metal compound). When the first conductive layer E10 includes graphene, the first conductive layer E10 may be a single graphene layer or a stack of a plurality of graphene layers. When the second conductive layer E20 includes a metallic material (namely, metal or metal compound), various electrode materials for use in general semiconductor devices may be used as the metallic material. The second conductive layer E20 may be transparent or may not be transparent.

A structure of the semiconductor layer S10 will now be described in greater detail.

The 2D material used to form the semiconductor layer S10 may include a metal chalcogenide-based material having a 2D crystalline structure. For example, the metal chalcogenide-based material may include a transition metal and a chalcogen element. The transition metal may include one of Mo, W, Nb, V, Ta, Ti, Zr, Hf, Tc, and Re, and the chalcogen element may include one of S, Se, and Te. The metal chalcogenide-based material may be a transition metal dichalcogenide (TMD) material. The TMD material may be expressed as $MX_2$, where M denotes a transition metal and X denotes a chalcogen element. M may be, for example, Mo, W, Nb, V, Ta, Ti, Zr, Hf, Tc, or Re, whereas X may be S, Se, or Te. For example, the TMD material may be, for example, $WSe_2$, $WTe_2$, $WS_2$, $MoSe_2$, $MoTe_2$, $MoS_2$, $ZrS_2$, $ZrSe_2$, $HfS_2$, $HfSe_2$, $NbSe_2$, or $ReSe_2$. However, the aforementioned TMD materials are examples, and various other TMD materials may be used. The 2D material of the semiconductor layer S10 may be a 2D material other than the TMD material.

The semiconductor layer S10 may further include an intercalation material n10 disposed between layers of the 2D material, wherein the intercalation material n10 may include, for example, lithium (Li) or potassium (K). For example, the intercalation material n10 may include Li atoms, K atoms, or both Li atoms and K atoms. Although a plurality of atoms (e.g., Li, K, or the like) forming the intercalation material n10 are regularly arranged in FIG. 1, this is for convenience of explanation, and an actual arrangement of atoms may be different from the arrangement of FIG. 1. The intercalation material n10 may also be between the semiconductor layer S10 and the first conductive layer E10. The intercalation material n10 may also be between the semiconductor layer S10 and the second conductive layer E20. The intercalation material n10 may increase carrier mobility (e.g., electron mobility) in a direction perpendicular to the semiconductor layer S10 (e.g., c-axis direction). In addition, the intercalation material n10 may lower contact resistance between the semiconductor layer S10 and another material layer bonded thereto (e.g., E10 or E20). In this connection, the performance and operational characteristics of the semiconductor device may improve.

The semiconductor layer S10 may have a thickness of about 1 nm or greater. The thickness of the semiconductor layer S10 may be about 1 nm to about 200 nm or about 1 nm to about 100 nm. In some cases, the thickness of the semiconductor active layer S10 may be several μm or greater or several tens of μm or greater. The semiconductor layer S10 may have a thickness of several hundreds of μm. Because the semiconductor layer S10 may have a relatively high carrier mobility and a relatively low contact resistance, the thickness of the semiconductor layer S10 may be favorably increased. The semiconductor layer S10 may have a width of several nm to several hundreds of μm. The width of the semiconductor layer S10 may be related with a process of introducing the intercalation material n10 into the semiconductor layer S10. According to types and applications of the semiconductor device, the width of the semiconductor layer S10 may be appropriately selected. As necessary, the semiconductor layer S10 may be doped with a p-type dopant or an n-type dopant. The p-type and n-type dopants may be p-type and n-type dopants for use in general 2D materials. Alternatively, the semiconductor layer S10 may be an undoped layer, which may be an intrinsic semiconductor.

For convenience of explanation, FIG. 1 illustrates the semiconductor layer S10 and the first conductive layer E10 in an atomic scale showing a combination state of atoms. The substrate SUB10 and the second conductive layer E20 are illustrated in a different scale from the atomic scale for the semiconductor layer S10. Accordingly, an actual ratio between thicknesses of the semiconductor layer S10 and the second conductive layer E20 may be different from that shown in FIG. 1. An actual ratio between thicknesses of the first conductive layer E10 and the second conductive layer E20 may also be different from that shown in FIG. 1. This is also true in FIGS. 2, 6-8, 11, and 12.

Figure 2:
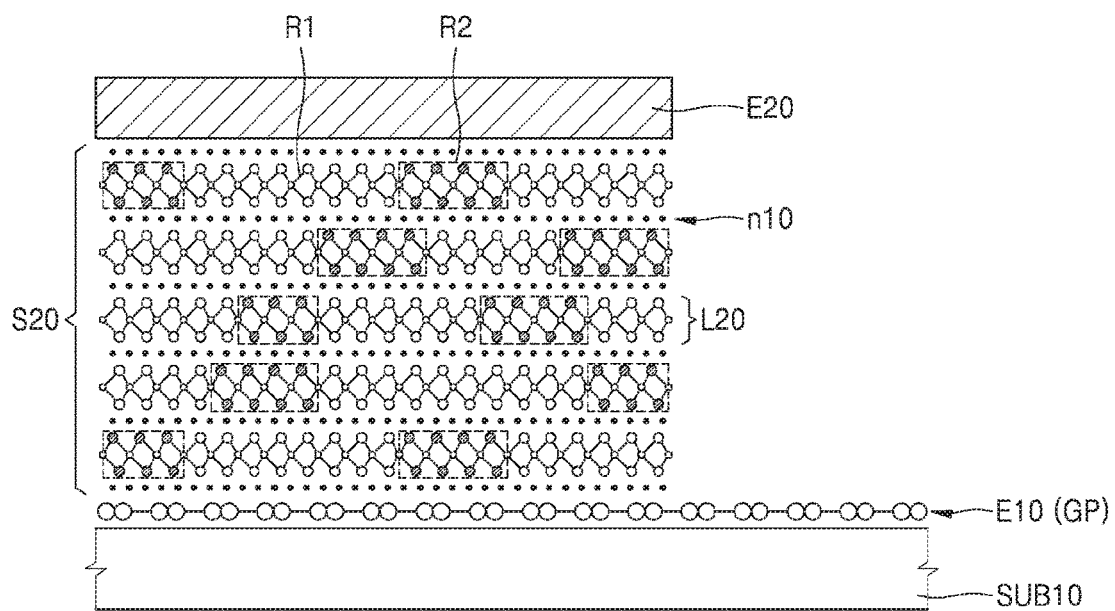
FIG. 2 is a cross-sectional view of a semiconductor device including a 2D material, according to some example embodiments.

FIG. 2 is a cross-sectional view of a semiconductor device including a 2D material, according to some example embodiments.

Referring to FIG. 2, the semiconductor device may include a semiconductor layer S20. The semiconductor layer S20 may include a 2D material, which may include a single-layer structure L20 having a 2D crystalline structure. The semiconductor layer S20 may further include an intercalation material n10 disposed between layers of the 2D material.

The 2D material that constitutes the semiconductor layer S20 may include a first region R1 having a first crystalline structure, and a second region R2 having a second crystalline structure that is different from the first crystalline structure. The single-layer structure L20 may include at least one first region R1 and/or at least one second region R2. The semiconductor layer S20 may be obtained by changing the crystalline structures of some regions of a semiconductor layer entirely having the first crystalline structure (e.g., the semiconductor layer S10 of FIG. 1) to the second crystalline structures. A plurality of second regions R2 may be distributed within the semiconductor layer S20. A distribution and a density of the second regions R2 in FIG. 2 are merely an example, and thus may vary.

The crystalline structure (e.g., the first crystalline structure) of the first region R1 in the semiconductor layer S20 may be, for example, a 2H phase. The crystalline structure (e.g., the second crystalline structure) of the second region R2 in the semiconductor layer S20 may include at least one of, for example, a 1T phase and a 1T' phase. The first crystalline structure (e.g., the 2H phase) of the first region R1 may represent semiconductor characteristics, and the second crystalline structure (e.g., the 1T or 1T' phase) may represent metal characteristics or metalloid (semi-metal) characteristics. The 1T phase may represent metal characteristics, and the 1T' phase may represent metalloid (semi-metal) characteristics. Accordingly, the second region R2 may have higher electrical conductivity (lower electric resistance) than the first region R1. Because the first region R1 of the semiconductor layer S20 may be a semiconductor region, even when there are metallic or metalloid second regions R2 in the semiconductor layer S20, the semiconductor layer S20 may entirely have semiconductor characteristics.

The 2D material of the semiconductor layer S10 of FIG. 1 entirely has the same crystalline structure, whereas the 2D material of the semiconductor layer S20 of FIG. 2 may have the first regions R1 having the first crystalline structure and the second regions R2 having the second crystalline structure. The semiconductor layer S10 of FIG. 1 may entirely have a crystalline structure corresponding to the first crystalline structure. A result of changing the crystalline structures (e.g., the first crystalline structures) of some regions of the semiconductor layer S10 into the second crystalline structures may be the semiconductor layer S20 of FIG. 2. This partial change in the crystalline structure of the semiconductor layer S10 may be induced by the intercalation material n10. According to the types of 2D material and intercalation process conditions, a crystalline structure may be entirely maintained as in the semiconductor layer S10 of FIG. 1, or the semiconductor layer S20 of FIG. 2 may be formed due to a partial change in a crystalline structure. Because the semiconductor layer S20 of FIG. 2 has a structure in which the first crystalline structure and the second crystalline structure are mixed, the semiconductor layer S20 of FIG. 2 may be considered to have a polymorphic crystalline structure.

The rest of the structure of the semiconductor device of FIG. 2, except for the semiconductor layer S20, may be substantially the same as the semiconductor device of FIG. 1. The first conductive layer E10 may be formed on a first surface of the semiconductor layer S20, and the second conductive layer E20 may be formed on a second surface of the semiconductor layer S20 opposite to the first surface. Accordingly, the semiconductor device may be a vertical-type device.

As shown in FIG. 2, when the semiconductor layer S20 includes the first region R1 having the first crystalline structure and the second region R2 having the second crystalline structure, the carrier mobility and the electrical conductivity of the semiconductor layer S20 may improve, and the contact resistance between the semiconductor layer S20 and another material layer (e.g., the first or second conductive layer E10 or E20) bonded thereto may decrease. Electrical characteristics or photoelectrical characteristics in a thickness direction of the semiconductor layer S20, namely, a c-axis direction (vertical direction), may improve. Thus, the performance and operational characteristics of the semiconductor device may improve.

Figure 3:
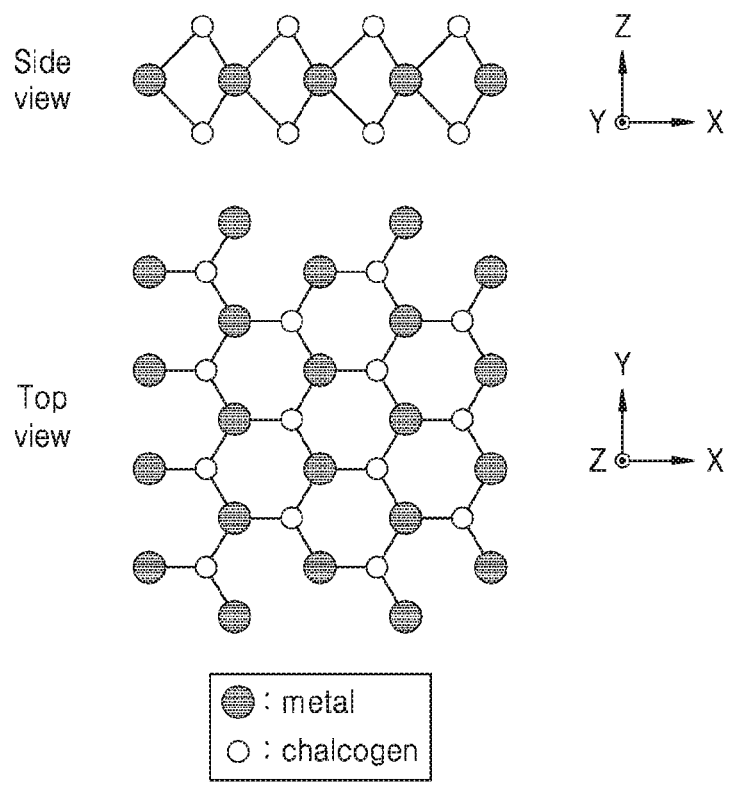
FIG. 3 is a diagram illustrating a first crystalline structure (e.g., a first crystalline phase) of a 2D material that is applicable to a semiconductor device according to some example embodiments.

FIG. 3 is a diagram illustrating a first crystalline structure (e.g., a first crystalline phase) of a 2D material that is applicable to a semiconductor device according to some example embodiments. The 2D material may be $MX_2$, where M denotes a metal element and X denotes a chalcogen element. In other words, the 2D material may be a TMD material. The TMD material may be, for example, $WSe_2$, $WTe_2$, $WS_2$, $MoSe_2$, $MoTe_2$, $MoS_2$, $ZrS_2$, $ZrSe_2$, $HfS_2$, $HfSe_2$, $NbSe_2$, or $ReSe_2$. FIG. 3 includes a structure viewed from the side (e.g., a side view) and a structure viewed from the top (e.g., a top view). This is the same in FIGS. 4 and 5.

Referring to FIG. 3, the first crystalline structure of the 2D material MX2 may be, for example, a 2H structure (e.g., a 2H phase). The 2H structure may represent semiconductor characteristics. The 2D material of the semiconductor layer S10 of FIG. 1 may have a 2H structure. The first region R1 in the semiconductor layer S20 of FIG. 2 may have a 2H structure.

Figure 4:
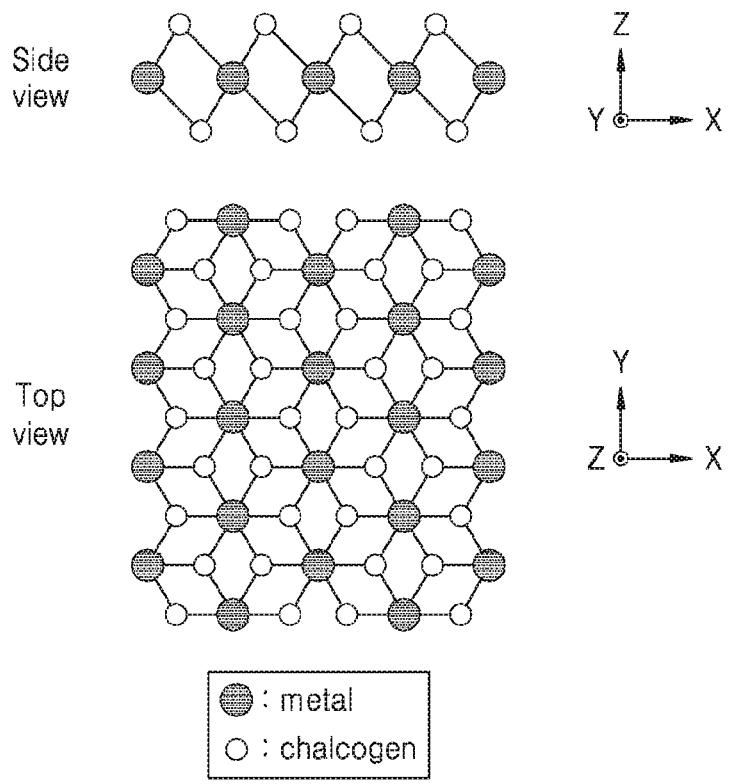
FIGS. 4 and 5 are diagrams illustrating second crystalline structures (e.g., second crystalline phases) of a 2D material that is applicable to a semiconductor device according to some example embodiments.
Figure 5:
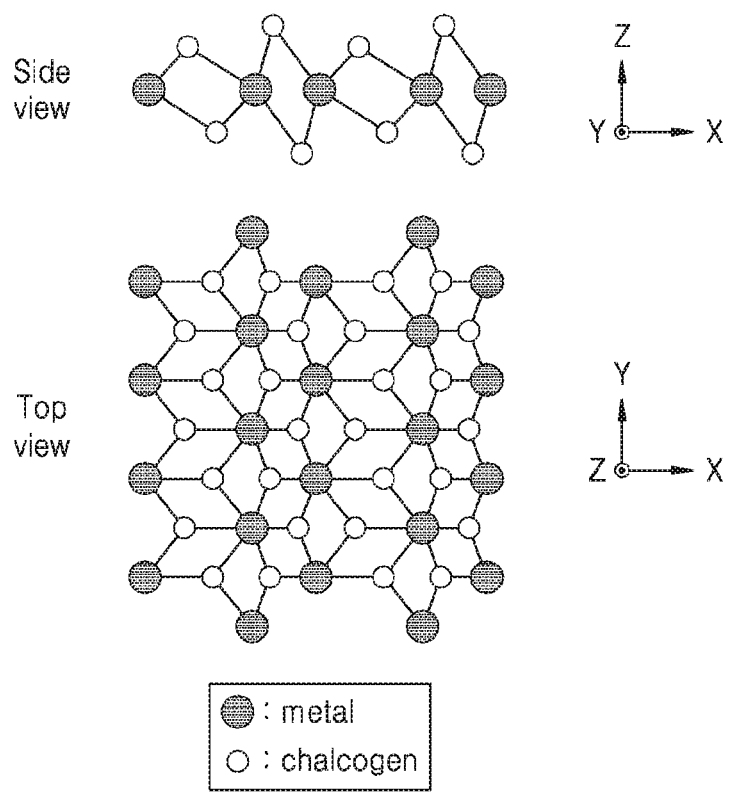

FIGS. 4 and 5 are diagrams illustrating second crystalline structures (e.g., second crystalline phases) of a 2D material that is applicable to a semiconductor device according to some example embodiments. The 2D material may be $MX_2$.

Referring to FIGS. 4 and 5, the second crystalline structure of the 2D material $MX_2$ may be, for example, a 1T structure (e.g., a 1T phase) as shown in FIG. 4 or a 1T' structure (e.g., a 1T' phase) as shown in FIG. 5. The 1T structure of FIG. 4 may represent metal characteristics, and the 1T' structure of FIG. 5 may represent metalloid (semimetal) characteristics. The second region R2 in the semiconductor layer S20 of FIG. 2 may have at least one of the 1T structure and the 1T' structure.

A 2D material of the crystalline structures of FIGS. 3-5 may be a TMD, where the TMD satisfies a stoichiometric composition of $MX_2$. A crystalline structure when the 2D material does not satisfy a stoichiometric composition or has a near-stoichiometric composition may be a result of somewhat changing the structures of FIGS. 3-5. However, even in this case, the terms "a 2H structure (2H phase)", "a 1T structure (1T phase)", and "a 1T' structure (1T' phase)" may be efficiently used. In some cases, a 2D material may be a material other than the TMD material.

Because a vertical-type semiconductor device using a 2D material may exhibit a relatively higher current density even at a low input voltage than a horizontal-type (planar-type) semiconductor device, the vertical-type semiconductor device is highly likely to be utilized as a low power device. In addition, because the 2D material may have a small thickness and vertical-type devices may easily realize a short channel of several tens of nm or less, a manufacturing process of the vertical-type devices may be easy, and high-density integrated circuits (ICs) may be favorably realized due to small sizes of the vertical devices.

However, because a vertical-type device using a 2D material provides a small carrier mobility in a vertical direction, the vertical-type device may have weaknesses in terms of a speed or operational characteristics of a device. In other words, because the vertical-type device using the 2D material has a high interlayer resistance due to a van der Waals gap between layers of the 2D material, the mobility of carriers may degrade due to a scattering effect during a carrier movement in a vertical direction. In the case of vertical-type devices having a heterostructure in which a 2D material (e.g., TMD) and another material are bonded, characteristics of a bonding interface may be degraded for various reasons. For example, contact resistance may increase and carrier mobility may decrease, due to a van der Waals gap or a Schottky barrier existing on a bonding interface between a 2D material (e.g., TMD) and metal or another 2D material. Due to a screening effect between layers because of the characteristics of a vertical-type structure, a gate voltage may not be smoothly transmitted in a vertical direction, and consequently, a characteristic control and a performance improvement of vertical-type devices may be difficult.

According to some example embodiments, the semiconductor layers S10 and S20 each including the 2D material includes the intercalation material n10 between layers of each of the semiconductor layers S10 and S20, and, as necessary, the crystalline structure of the 2D material is partially changed. Thus, carrier mobility in a vertical direction may be greatly increased, and contact resistance and a Schottky barrier between the 2D material and another material (metal or another 2D material) may be lowered. Accordingly, the performance and operational characteristics of a vertical-type device may be greatly improved. When a vertical-type device employing a 2D material is realized, a device having high carrier mobility and low contact resistance may be realized. When a vertical-type device according to some example embodiments is used as an optoelectronic device, the optoelectronic device may have a good performance and good operational characteristics, such as improved external quantum efficiency (EQE), a high responsivity, and a high operation speed. The optoelectronic device may be a photodetector or a photovoltaic device, such as a solar cell. The optoelectronic device may be a luminous device, such as a semiconductor laser device or a light-emitting device (LED). When the vertical-type device according to some example embodiments is applied to a transistor (for example, as in FIGS. 11 and 12), a transistor having a high mobility, a low contact resistance, and good operational characteristics may be realized. The semiconductor device according to some example embodiments may be used as a low power device having a high current density even at a low input voltage, and is favorably applicable to realize high-density integrated circuits.

Although graphene is applied to the first conductive layer E10 and a metallic material (e.g., metal or metal compound) is applied to the second conductive layer E20 in FIGS. 1 and 2, the materials of the first conductive layer E10 and the second conductive layer E20 may vary. For example, a metallic material may be applied to the first conductive layer E10 and graphene may be applied to the second conductive layer E20, or a metallic material may be applied to both the first and second conductive layers E10 and E20, or graphene may be applied to both the first and second conductive layers E10 and E20. These examples are illustrated in FIGS. 6-8.

Figure 6:
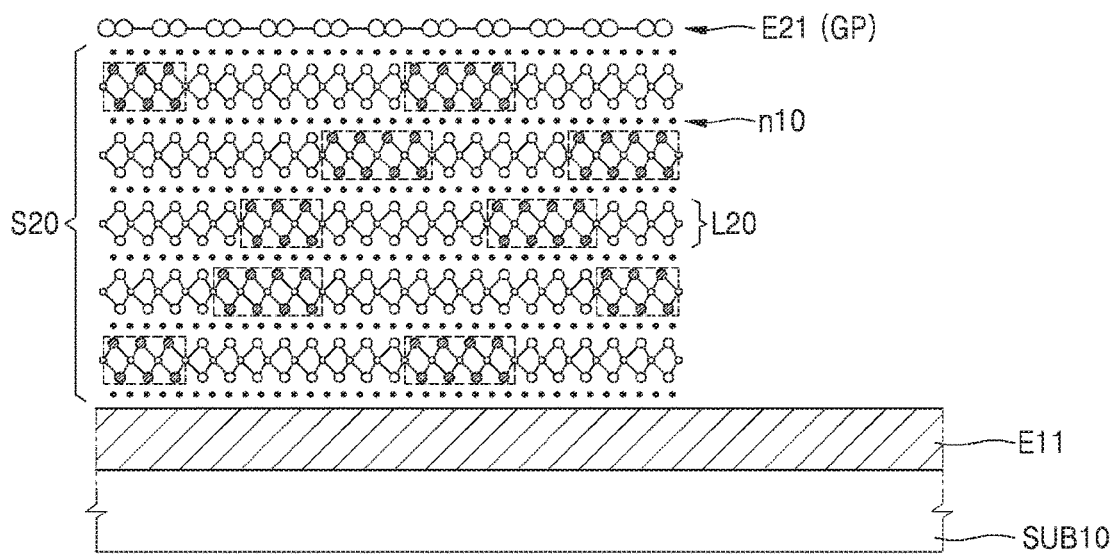
FIG. 6 is a cross-sectional view of a semiconductor device including a 2D material, according to some example embodiments.

Referring to FIG. 6, a first conductive layer E11 may include a metallic material (e.g., metal or a metal compound), and a second conductive layer E21 may include graphene GP. In this case, a semiconductor device may have a metal/2D semiconductor/graphene structure.

Figure 7:
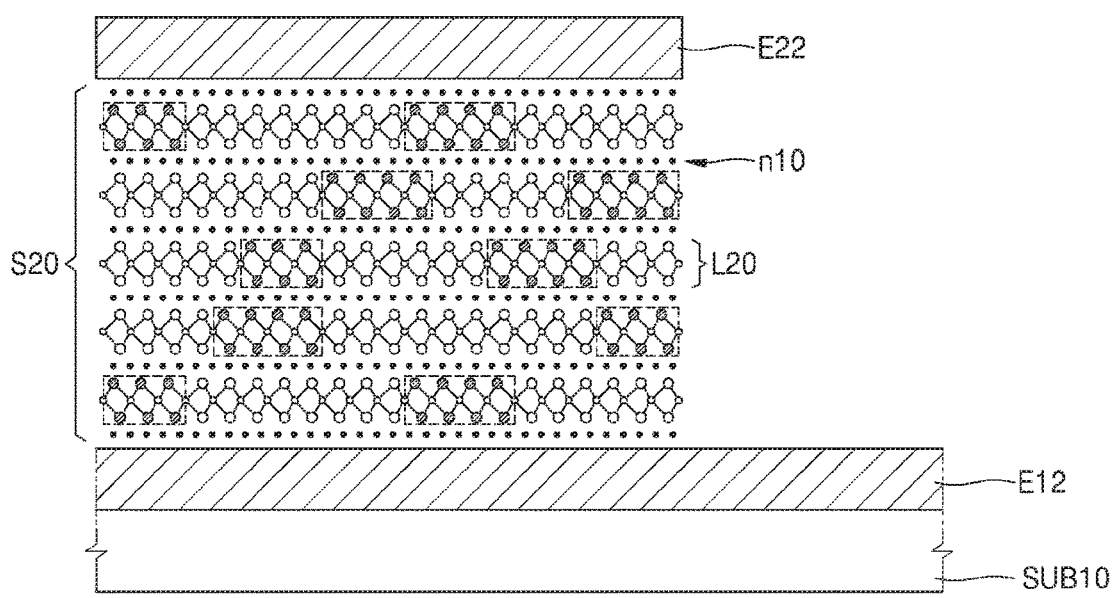
FIG. 7 is a cross-sectional view of a semiconductor device including a 2D material, according to some example embodiments.

Referring to FIG. 7, both a first conductive layer E12 and a second conductive layer E22 may include metallic material(s) (e.g., metal or metal compound). The metallic material(s) of the first and second conductive layers E12 and E22 may be the same as each other or different from each other. In this case, a semiconductor device may have a metal/2D semiconductor/metal structure.

Figure 8:
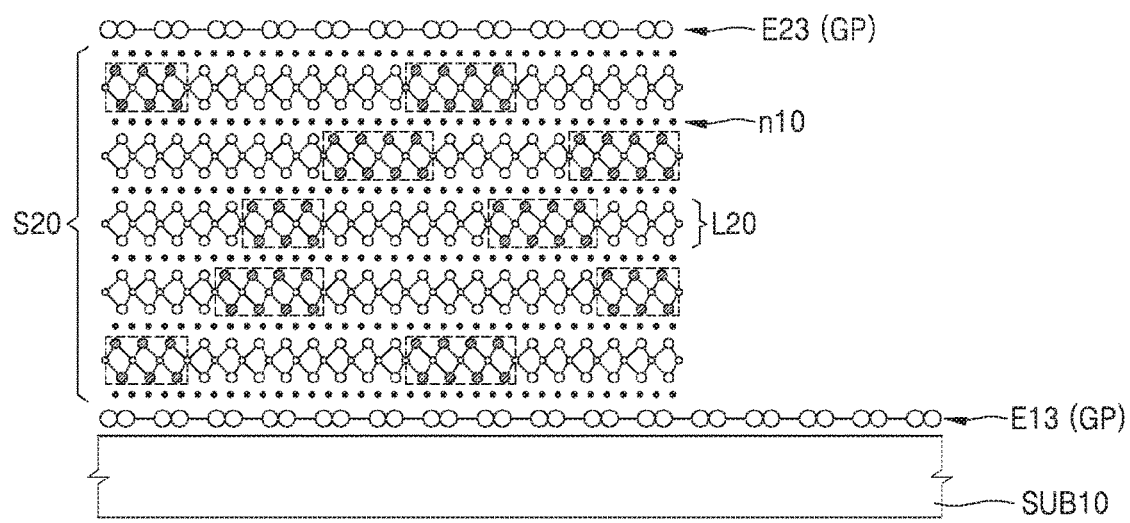
FIG. 8 is a cross-sectional view of a semiconductor device including a 2D material, according to some example embodiments.

Referring to FIG. 8, both a first conductive layer E13 and a second conductive layer E23 may include graphene GP. In this case, a semiconductor device may have a graphene/2D semiconductor/graphene structure.

FIGS. 6-8 illustrate a case where the materials of the first and second conductive layers E10 and E20 in the device structure of FIG. 2 are changed. Similarly, the materials of the first and second conductive layers E10 and E20 in the device structure of FIG. 1 may be changed. In other words, in FIGS. 6-8, the semiconductor layer S10 instead of the semiconductor layer S20 may be applied.

Figure 9:
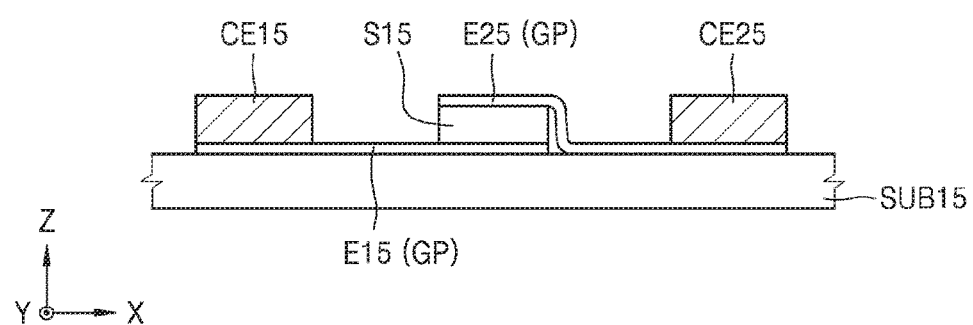
FIG. 9 is a cross-sectional view of a semiconductor device including a 2D material, according to some example embodiments.
Figure 10:
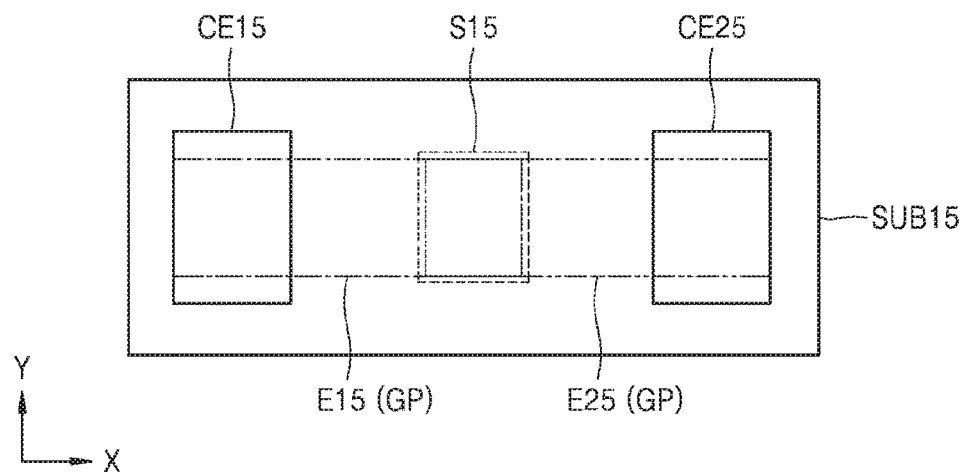
FIG. 10 is a plan view of an embodiment of a planar structure of the semiconductor device of FIG. 9.

FIG. 9 is a cross-sectional view of a semiconductor device including a 2D material, according to some example embodiments. FIG. 10 is a plan view of an example of a planar structure of the semiconductor device of FIG. 9.

Referring to FIGS. 9 and 10, the semiconductor device may include a first conductive layer E15 and a second conductive layer E25, which are apart from each other, and a semiconductor layer S15 disposed therebetween. The first conductive layer E15 may be a first electrode and the second conductive layer E25 may be a second electrode. The first conductive layer E15 may be formed on a substrate SUB15. The semiconductor layer S15 may be formed on at least a portion of the first conductive layer E15. The second conductive layer E25 may be formed to cover at least a portion of the semiconductor layer S15 on the substrate SUB15. Thus, the first conductive layer E15, the semiconductor layer S15, and the second conductive layer E25 may at least partially overlap each other in a vertical direction (e.g., a Z-axis direction). In this respect, the semiconductor device may be deemed to include a vertically stacked structure. The substrate SUB15 may be, for example, a semiconductor substrate such as a silicon substrate. In this case, the substrate SUB15 may include an insulation layer (not shown), such as a silicon oxide layer, formed on a surface (e.g., upper surface) of the substrate SUB15. The first conductive layer E15, the semiconductor layer S15, and the second conductive layer E25 may be formed on the insulation layer. However, a material of the substrate SUB15 may vary. When the insulation layer is used, a material of the insulation layer may also vary. The substrate SUB15 may be a flexible substrate or a rigid substrate, and may be a transparent, opaque, or semi-transparent substrate.

The semiconductor layer S15 may correspond to the semiconductor layer S10 of FIG. 1 or the semiconductor layer S20 of FIG. 2. Accordingly, the semiconductor layer S15 may include a 2D material and an intercalation material disposed between layers of the 2D material. The 2D material of the semiconductor layer S15 may include a first region having a first crystalline structure, and a second region having a second crystalline structure. At least one of the first conductive layer E15 and the second conductive layer E25 may include graphene GP. For example, both the first and second conductive layers E15 and E25 may include graphene. For example, one of the first and second electrodes E10 and E20 may include a graphene layer doped with a p-type dopant (e.g., a p-doped graphene layer), and the other may include a graphene layer doped with an n-type dopant (e.g., an n-doped graphene layer).

The first conductive layer E15 may extend from a semiconductor layer S15 in a first direction (e.g., a negative X-axis direction), and the second conductive layer E25 may extend from the semiconductor layer S15 in a second direction (e.g., an X-axis direction) opposite the first direction. The semiconductor device may further include a first contact electrode CE15 contacting (or electrically connected to) the first conductive layer E15, and a second contact electrode CE25 contacting (or electrically connected to) the second conductive layer E25. The first contact electrode CE15 and the second contact electrode CE25 may be apart from each other in a horizontal direction, for example, the X-axis direction. The first contact electrode CE15 and the second contact electrode CE25 may be positioned on the same level (height) or on almost the same level (height). The semiconductor layer S15 may be located between the first contact electrode CE15 and the second contact electrode CE25. The first conductive layer E15 may be considered to electrically connect the first contact electrode CE15 to a first region (for example, a lower surface) of the semiconductor layer S15, and the second conductive layer E25 may be considered to electrically connect the second contact electrode CE25 to a second region (for example, an upper surface) of the semiconductor layer S25. Respective extending directions of the first conductive layer E15 and the second conductive layer E25 may vary.

The semiconductor device of FIGS. 9 and 10 may be a flexible device. The semiconductor device may be a transparent device. When the first and second conductive layers E15 and E25 include graphene, the graphene may be flexible and have transparent characteristics. The 2D material of the semiconductor layer S15 may be flexible and have transparent characteristics. Accordingly, the semiconductor device may have flexible characteristics and transparent characteristics and is usefully applicable to various fields. For example, the semiconductor device is applicable to next-generation wearable devices. The structures of FIG. 1, FIG. 2, and FIGS. 6-8 are applicable to the device structure of FIGS. 9 and 10. Various modifications may be made to the structure of FIGS. 9 and 10.

Some example embodiments are applicable to not only optoelectronic devices, but also to other semiconductor devices such as transistors. Since a transistor is able to use three electrodes (e.g., a source electrode, a drain electrode, and a gate electrode), the transistor may be referred to as a 3-terminal device. Thus, a transistor according to some example embodiments may have a structure in which a third electrode (e.g., a gate electrode) is added to one of the structures of FIG. 1, FIG. 2, and FIGS. 6-10. These examples are illustrated in FIGS. 11 and 12.

Figure 11:
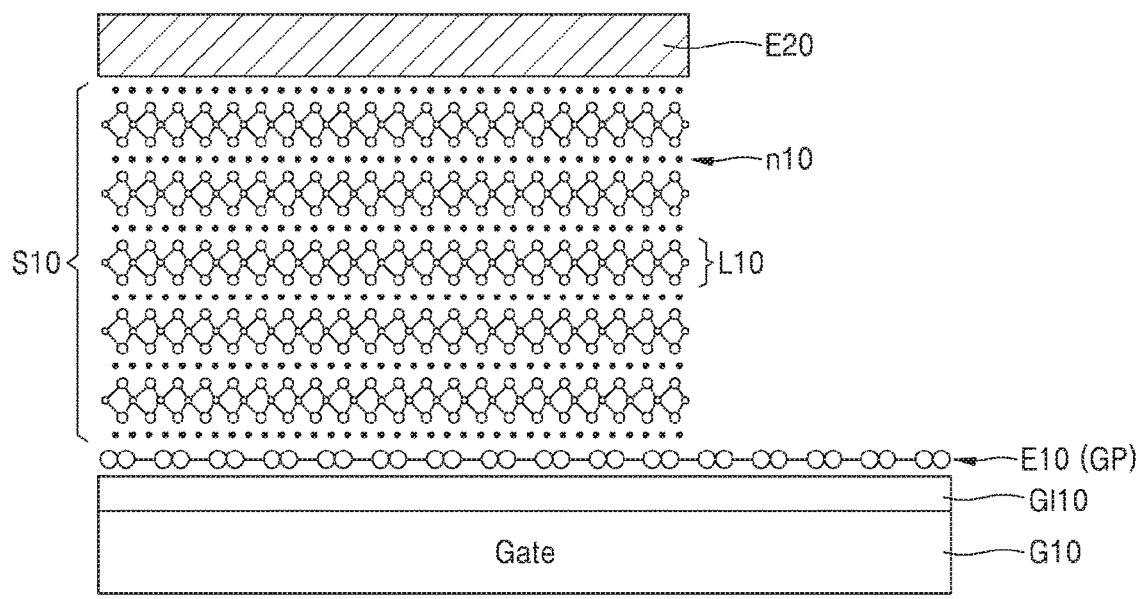
FIG. 11 is a cross-sectional view of a semiconductor device (transistor) including a 2D material, according to some example embodiments.
Figure 12:
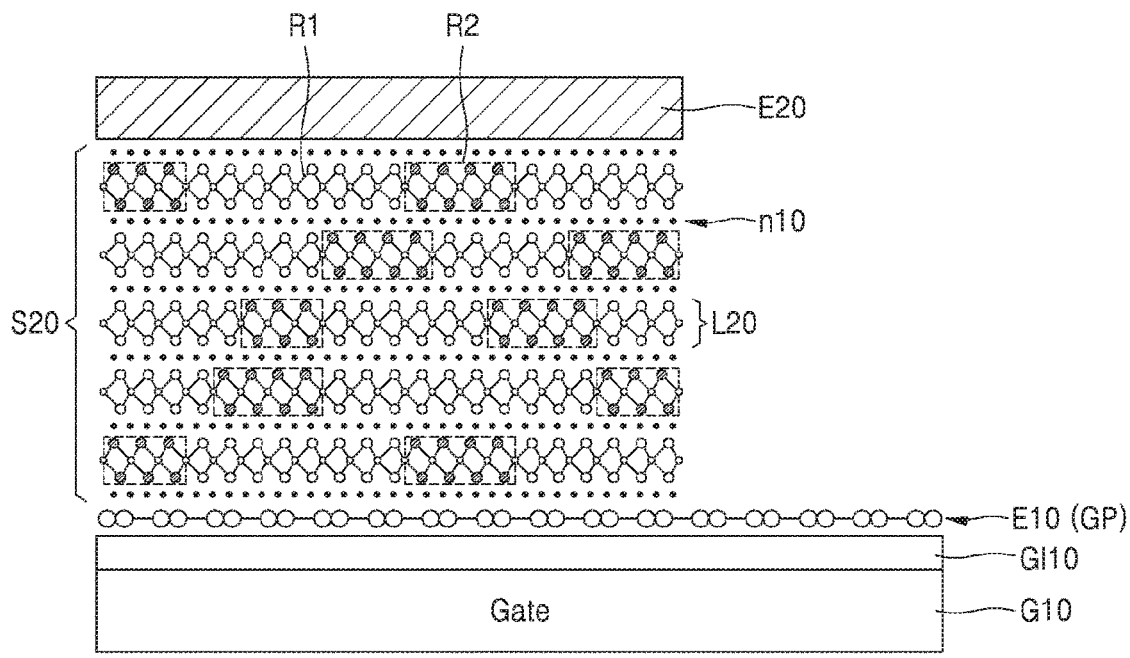
FIG. 12 is a cross-sectional view of a semiconductor device (transistor) including a 2D material, according to some example embodiments.

FIG. 11 is a cross-sectional view of a semiconductor device (transistor) including a 2D material, according to some example embodiments.

Referring to FIG. 11, similar to the structure of FIG. 1, a first conductive layer E10, a semiconductor layer S10, and a second conductive layer E20 may be provided. The first conductive layer E10, the semiconductor layer S10, and the second conductive layer E20 of FIG. 11 may be substantially the same as the first conductive layer E10, the semiconductor layer S10, and the second conductive layer E20 of FIG. 1, respectively. In FIG. 11, the semiconductor layer S10 may be used as a channel layer. The semiconductor device (transistor) may further include a gate electrode G10 for applying an electric field to the semiconductor layer S10. The gate electrode G10 may be formed of or include a 2D conductor, such as graphene, or may be formed of or include a general conductor other than the 2D conductor. The gate electrode G10 may be transparent or may not be transparent. A gate insulation layer GI10 may be formed between the semiconductor layer S10 and the gate electrode G10. The gate insulation layer GI50 may be formed of or include a 2D insulator, such as hexagonal boron nitride (h-BN), or may be formed of or include a general insulator other than the 2D insulator. For example, the gate electrode G10 may be doped silicon, and the gate insulation layer GI10 may be silicon oxide. Alternatively, the gate electrode G10 may be graphene, and the gate insulation layer GI10 may be h-BN. The gate insulation layer GI10 may be formed on the gate electrode G10, and the first conductive layer E10, the semiconductor layer S10, and the second conductive layer E20 may be formed on the gate insulation layer GI10. One of the first and second conductive layers E10 and E20 may be a source electrode, and the other may be a drain electrode. For example, the first conductive layer E10 may be a source electrode and the second conductive layer E20 may be a drain electrode. However, the roles of the source electrode and the drain electrode may be exchanged.

The semiconductor layer S10 in the semiconductor device of FIG. 11 may be replaced by the semiconductor layer S20 of FIG. 2. An example is illustrated in FIG. 12. The semiconductor layer S20 of FIG. 12 may include a 2D material and the intercalation material n10 disposed between layers of the 2D material, and the 2D material may include the first region R1 having the first crystalline structure and the second region R2 having the second crystalline structure. The rest of the structure of the semiconductor device of FIG. 12, except for the semiconductor layer S20, may be substantially the same as the semiconductor device of FIG. 11. The materials of the first conductive layer E10 and the second conductive layer E20 in FIGS. 11 and 12 may vary as described above with reference to FIGS. 6-8.

The semiconductor devices of FIGS. 11 and 12 may be transistors. The transistors may have high mobility, low contact resistance, and good operational characteristics. The transistors may provide high current density even at a low input voltage and have a small size and a small thickness, and thus are favorably applicable to realize a high-density integrated circuit. A transistor according to some example embodiments may be a barrier transistor, namely, a barristor. The transistor according to some example embodiments may be an optical transistor, namely, a phototransistor.

Figure 13:
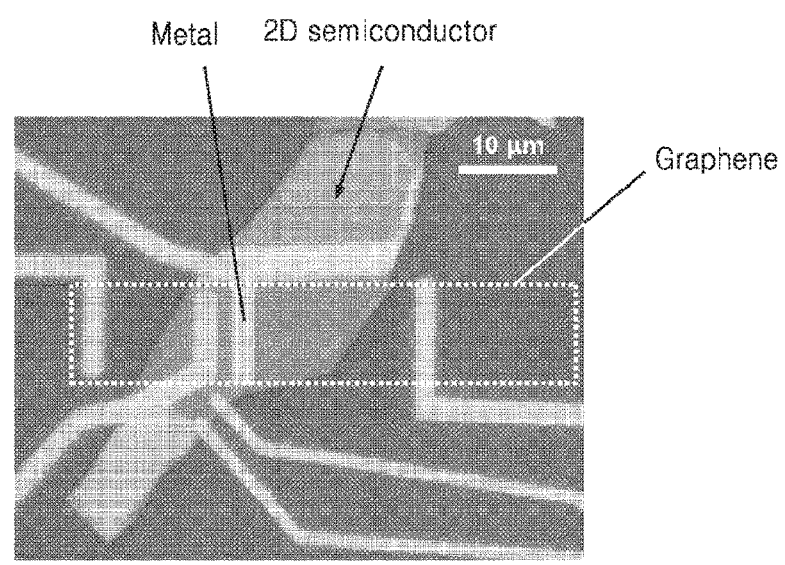
FIG. 13 is an optical microscope image of a semiconductor device manufactured according to some example embodiments.

FIG. 13 is an optical microscope image of a semiconductor device manufactured according to some example embodiments.

Referring to FIG. 13, the semiconductor device includes a graphene layer, a 2D semiconductor material layer disposed on the graphene layer, and a metal layer (upper electrode) disposed on the 2D semiconductor material layer. The 2D semiconductor material layer includes a $WSe_2$ layer ($WSe_2$ flake) and an intercalation material (Li). The 2D semiconductor material layer may be formed by dipping the $WSe_2$ layer within a certain intercalation solution for a certain period of time. The intercalation solution may be an n-butyllithium solution. The metal layer was an Au layer. A substrate of the semiconductor device includes a gate electrode.

Figure 14A:
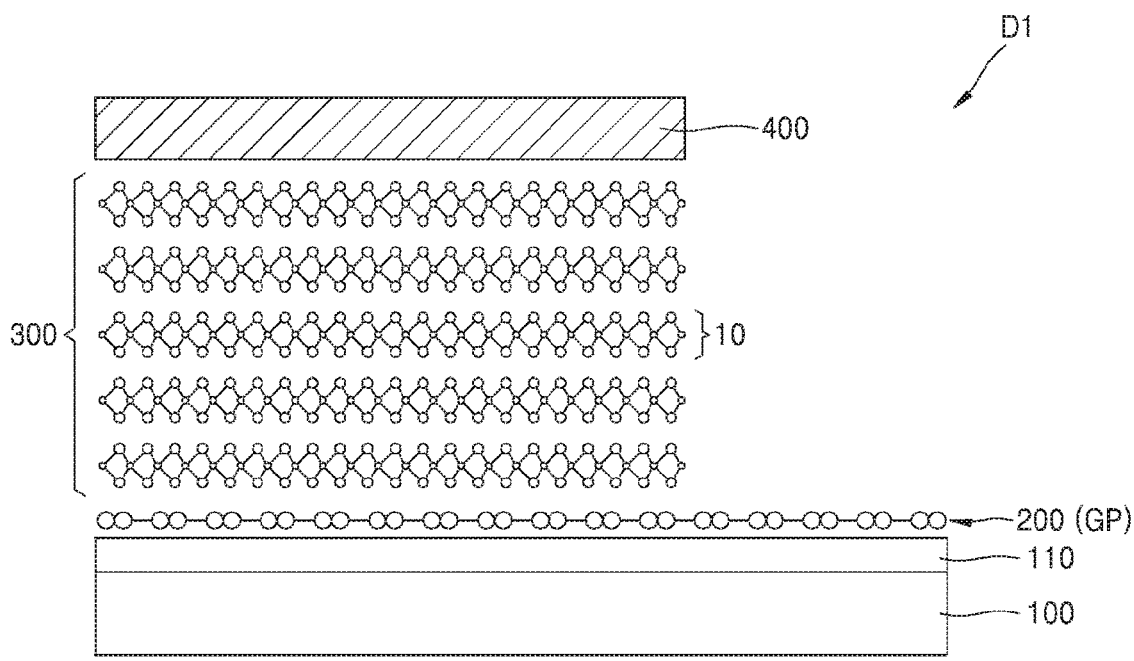
FIGS. 14A-14C are cross-sectional views for explaining a method of manufacturing a semiconductor device including a 2D material, according to some example embodiments.
Figure 14B:
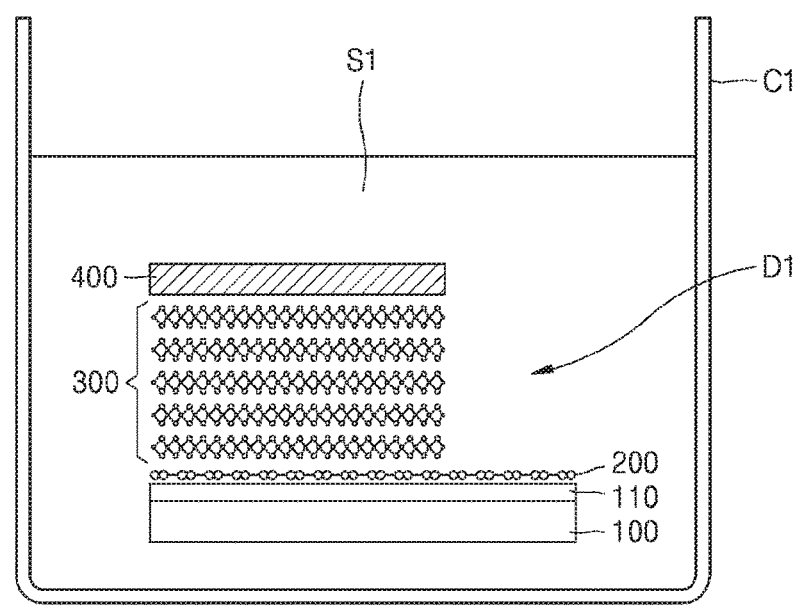
Figure 14C:
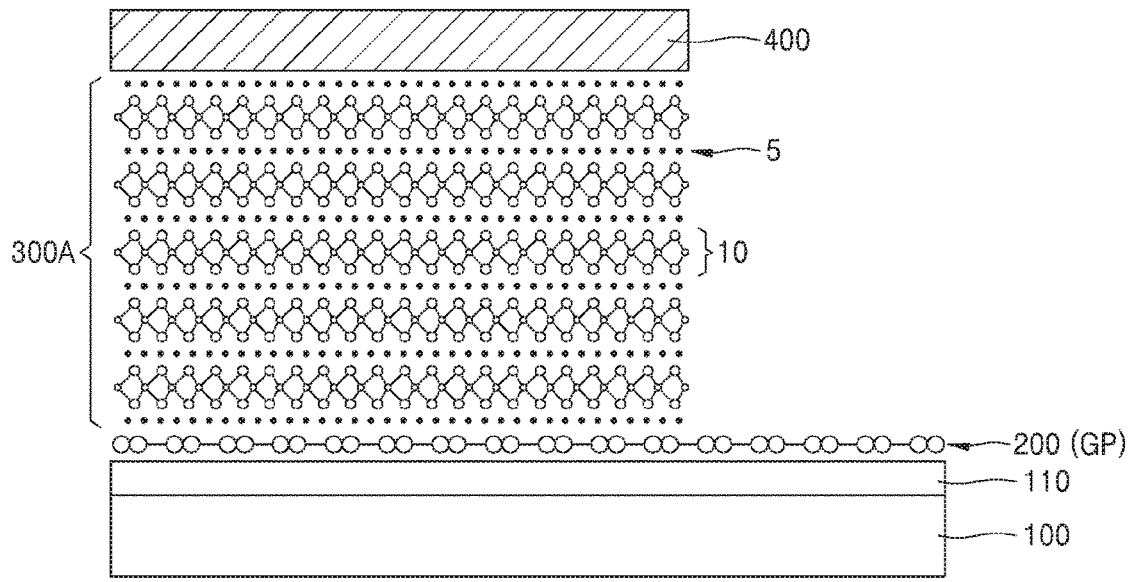

FIGS. 14A-14C are cross-sectional views for explaining a method of manufacturing a semiconductor device including a 2D material, according to some example embodiments.

Referring to FIG. 14A, an insulation layer 110 may be formed on a substrate 100. The substrate 100 may be or include a gate electrode. In this case, the insulation layer 110 may be a gate insulation layer. For example, the substrate 100 may be doped silicon, and the insulation layer 110 may be silicon oxide. However, the materials of the substrate 100 and the insulation layer 110 may vary. For example, the substrate 100 may include a 2D conductor, such as graphene, or a general conductor other than the 2D conductor, and the insulation layer 110 may include a 2D insulator, such as h-BN, or a general insulator other than the 2D insulator.

A first conductive layer 200 may be formed on the insulation layer 110. The first conductive layer 200 may include graphene, metal, or metal compound. Herein, the first conductive layer 200 includes graphene GP. For example, graphene is grown on another substrate (not shown) via chemical vapor deposition (CVD) and is then transferred onto the insulation layer 110. The graphene transferred onto the insulation layer 110 may be patterned via lithography. In this case, the first conductive layer 200 may be considered to include patterned graphene.

A semiconductor layer 300 including a 2D material may be formed on the first conductive layer 200. The 2D material of the semiconductor layer 300 may have a layered structure. The semiconductor layer 300 may include a single-layer structure 10 having a 2D crystalline structure, or include a stack of a plurality of single-layer structures 10 each having a 2D crystalline structure. The 2D material may include a metal chalcogenide-based material, for example, a TMD material. The TMD material may be expressed as $MX_2$, where M may be a transition metal, for example, Mo, W, Nb, V, Ta, Ti, Zr, Hf, Tc, or Re and X may be a chalcogen element, for example, S, Se, or Te. For example, the TMD material may be, for example, $WSe_2$, $WTe_2$, $WS_2$, $MoSe_2$, $MoTe_2$, $MoS_2$, $ZrS_2$, $ZrSe_2$, $HfS_2$, $HfSe_2$, $NbSe_2$, or $ReSe_2$. The 2D material of the semiconductor layer 300 in the present operation may have an entirely uniform (or substantially uniform) crystalline structure. For example, the 2D material may entirely have a 2H structure (2H phase). The semiconductor layer 300 may be formed on the first conductive layer 200 by using a dry transfer method, a growth method, or a deposition method.

Then, a second conductive layer 400 may be formed on the semiconductor layer 300. The second conductive layer 400 may be formed of metal, metal compound, or may be formed of or include a 2D conductor, for example, graphene. Herein, the second conductive layer 400 is formed of a metallic material (e.g., metal or metal compound). The second conductive layer 400 may be formed via electron beam lithography or photolithography, during which metal or metal compound may be deposited via physical vapor deposition (PVD). For example, the metal or the metal compound may be deposited via e-beam evaporation or thermal evaporation.

A stacked structure of FIG. 14A formed in this way may be considered to be a device unit D1. The device unit D1 may be considered to include the semiconductor layer 300 including the 2D material.

Referring to FIG. 14B, the device unit D1 of FIG. 14A may be processed with a solution S1 including an intercalation material. The solution S1 may be referred to as an intercalation solution because the solution S1 includes an intercalation material. A container C1 is filled with the solution S1, and then the device unit D1 may be dipped within the solution S1 for a certain period of time. The solution S1 may include Li, K, or the like as the intercalation material. For example, the solution S1 may include at least one selected from the group consisting of n-butyllithium, tert-butyllithium (t-Bu-Li), methyllithium (Me-Li), and a potassium hexafluorophosphate solution. Within the solution S1, the device unit D1 may be dipped for several minutes to about 100 hours. For example, the device unit D1 may be dipped for about 30 minutes to about 100 hours. The temperature of the solution S1 may be room temperature (about 25° C.) to about 100° C. The operation of FIG. 14B may be conducted under an inert gas atmosphere, for example, an Ar gas atmosphere. Accordingly, ions (intercalation material) of the solution S1 (e.g., Li or K ions) may be limited and/or prevented from reacting with moisture or air.

Via the process of FIG. 14B, the intercalation material of the solution S1 may be inserted between 2D material layers of the semiconductor layer 300. Thereafter, the device unit D1 may be taken out of the solution S1 and undergo a cleaning and drying process. For example, a remaining intercalation material (Li or K) or an organic residue may be removed via cleaning by using a solvent, such as hexane and isopropyl alcohol (IPA). The drying process may be conducted at room temperature (about 25° C.) to about 100° C. A result of the process of FIG. 14B is illustrated in FIG. 14C.

Referring to FIG. 14C, a semiconductor layer 300A having undergone the intercalation process may include an intercalation material 5 between layers of the 2D material. In other words, the intercalation material 5 may be inserted between single-layer structures 10 of the semiconductor layer 300A. The intercalation material 5 may include, for example, Li or K, or may include both Li and K. The device structure of FIG. 14C may correspond to, for example, the semiconductor device of FIG. 11.

According to some example embodiments, the crystalline structure of a partial region of the 2D material of the semiconductor layer 300 may be changed in the operation of FIG. 14B. In other words, the crystalline structure of the partial region of the 2D material may be changed from the first crystalline structure to the second crystalline structure. According to types of 2D material and intercalation process conditions, the change in the crystalline structure may occur. A result of the process of FIG. 14C is illustrated in FIG. 15.

Figure 15:
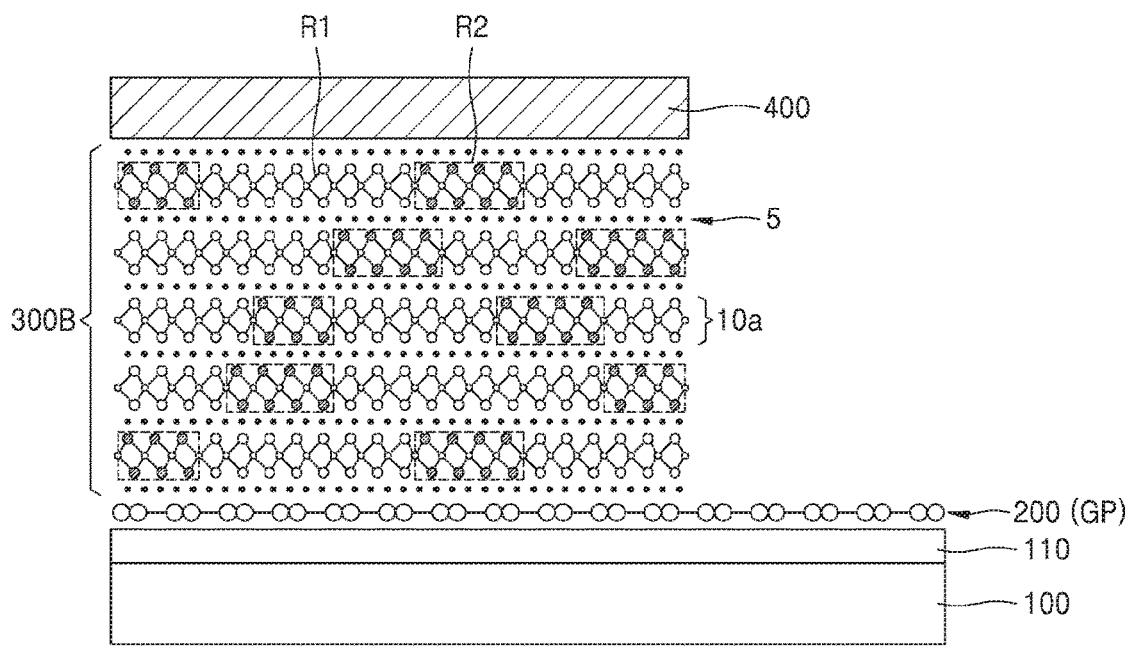
FIG. 15 is a cross-sectional view for explaining a method of manufacturing a semiconductor device including a 2D material, according to some example embodiments.

Referring to FIG. 15, a semiconductor layer 300B having undergone the intercalation process may include an intercalation material 5 between layers of the 2D material. The 2D material may include a first region R1 having a first crystalline structure, and a second region R2 having a second crystalline structure that is different from the first crystalline structure. The first crystalline structure may include, for example, a 2H phase, and the second crystalline structure may include, for example, at least one of a 1T phase and a 1T' phase. A single-layer structure of the semiconductor layer 300B is indicated by a reference numeral 10a. The single-layer structure 10a may include the first region R1 and the second region R2. The device structure of FIG. 15 may correspond to, for example, the semiconductor device of FIG. 12.

A principle that the crystalline structure of the semiconductor layer 300 is partially changed by the intercalation solution S1 of FIG. 14B will now be described in brief. The intercalation material of the solution S1 may be diffused and inserted between layers of the 2D material (e.g., TMD) of the semiconductor layer 300. The diffused and inserted intercalation material may provide electrons to the 2D material and may increase the electron density of the d-orbital within metal atoms of the 2D material. As the electron density of the d-orbital within the metal atoms increases, instability of a material structure may increase, and this problem may be addressed by changing the crystalline structure. For example, the crystalline structure may be changed from a trigonal structure to an octahedral structure. Consequently, the crystalline structure of the partial region of the 2D material may be changed from a 2H phase to a 1T or 1T' phase. This partial change in the crystalline structure may selectively occur according to the types of 2D material or intercalation process conditions.

Although the device unit D1 including the first conductive layer 200, the semiconductor layer 300, and the second conductive layer 400 stacked on the substrate 100 is dipped within the solution S1 and undergoes an intercalation process in FIGS. 14A-14C, this method may vary. For example, when no second conductive layers 400 are formed on the semiconductor layer 300, the intercalation process of FIG. 14B may be performed, and thereafter the second conductive layer 400 may be formed. Alternatively, only the semiconductor layer 300 may be dipped within the solution S1 and undergo the intercalation process, and then a device formation process (stacking process) using the semiconductor layer 300 may be conducted. Besides, the process of FIGS. 14A-14C may vary. By using/modifying the process of FIGS. 14A-14C and FIG. 15, the semiconductor devices of FIG. 1, FIG. 2, and FIGS. 6-10 may be manufactured.

Figure 16A:
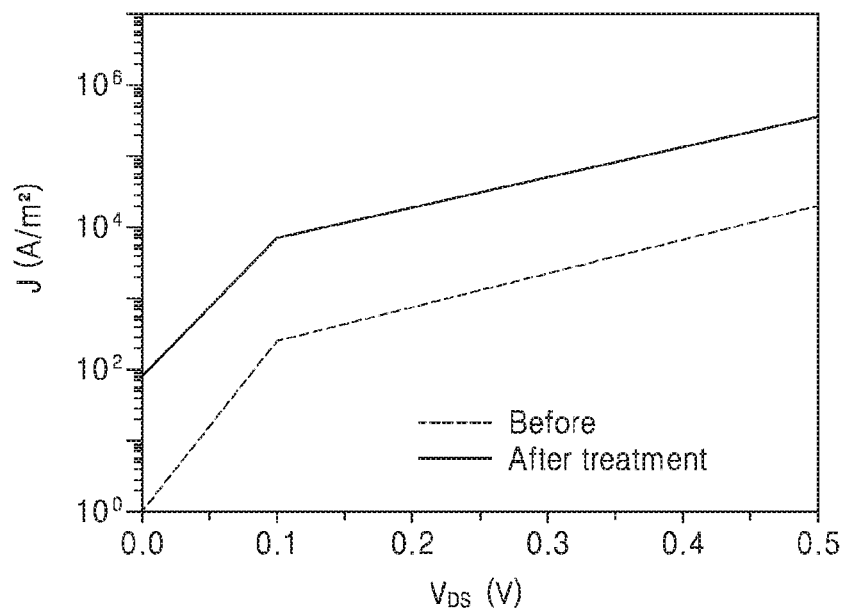
FIGS. 16A and 16B are graphs showing changes in current densities J of semiconductor devices before and after a solution treatment versus voltages between sources and drains of the semiconductor devices.
Figure 16B:
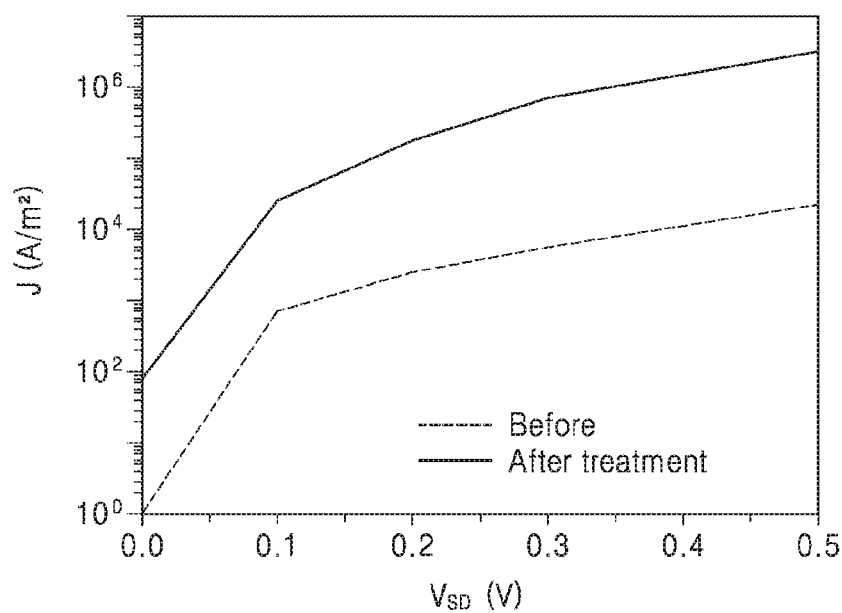

FIGS. 16A and 16B are graphs showing changes in current densities J of semiconductor devices before and after a solution treatment versus voltages between sources and drains of the semiconductor devices. FIG. 16A illustrates a case where a drain-source voltage VDS is greater than 0V, and FIG. 16B illustrates a case where a source-drain voltage $V_{SD}$ is greater than 0V. In this case, a first conductive layer (graphene) was a source electrode, and a second conductive layer (metal) was a drain electrode. The solution treatment is the same as that described above with reference to FIG. 14B, and an n-butyllithium solution was used.

Referring to FIGS. 16A and 16B, the current density of the semiconductor device after a solution treatment was increased by at most about 24 times (FIG. 16A) and at most about 130 times (FIG. 16B) the current density of the semiconductor device before a solution treatment.

Figure 17A:
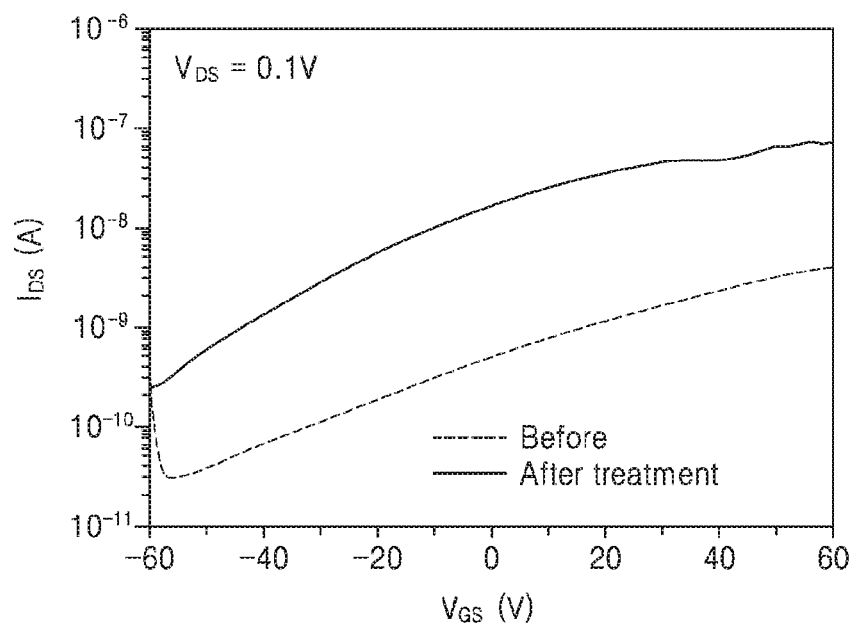
FIGS. 17A and 17B are graphs showing changes in drain currents IDS of semiconductor devices before and after a solution treatment versus gate voltages VGS of the semiconductor devices.
Figure 17B:
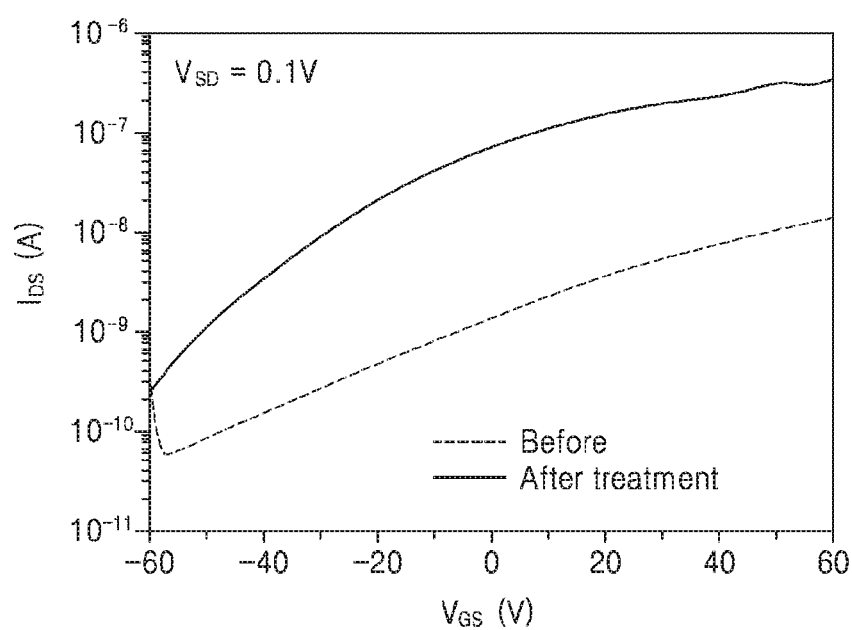

FIGS. 17A and 17B are graphs showing changes in drain currents $I_{DS}$ of semiconductor devices before and after a solution treatment versus gate voltages $V_{GS}$ of the semiconductor devices. FIG. 17A illustrates a case where a drain-source voltage $V_{DS}$ is 0.1V, and FIG. 17B illustrates a case where a source-drain voltage $V_{SD}$ is 0.1V.

Referring to FIGS. 17A and 17B, the drain current $I_{DS}$ of the semiconductor device after a solution treatment was increased by at most about 25 times (FIG. 17A) and at most about 50 times (FIG. 17B) the drain current $I_{DS}$ of the semiconductor device before a solution treatment.

Figure 18A:
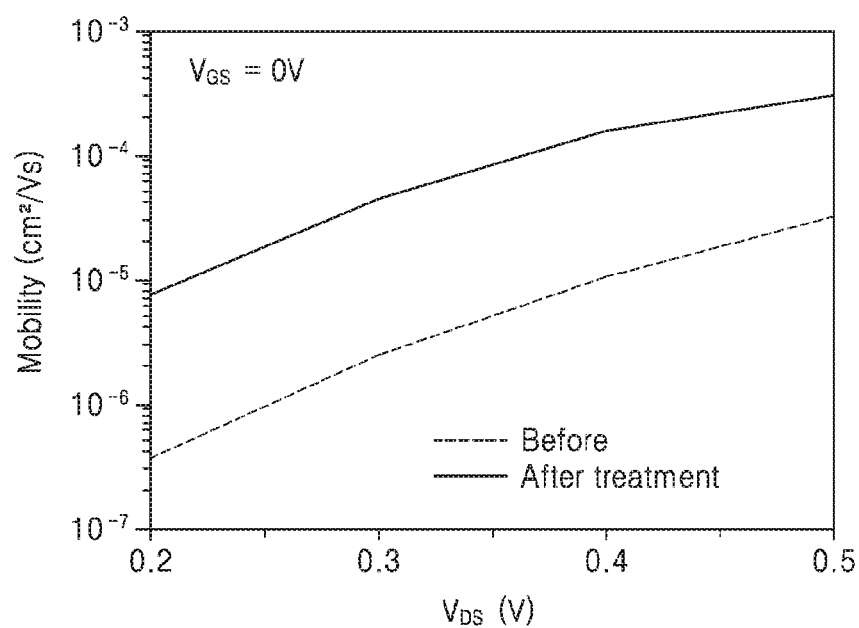
FIGS. 18A and 18B are graphs showing changes in mobility ($cm^2/Vs$) of semiconductor devices before and after a solution treatment versus voltages between sources and drains of the semiconductor devices.
Figure 18B:
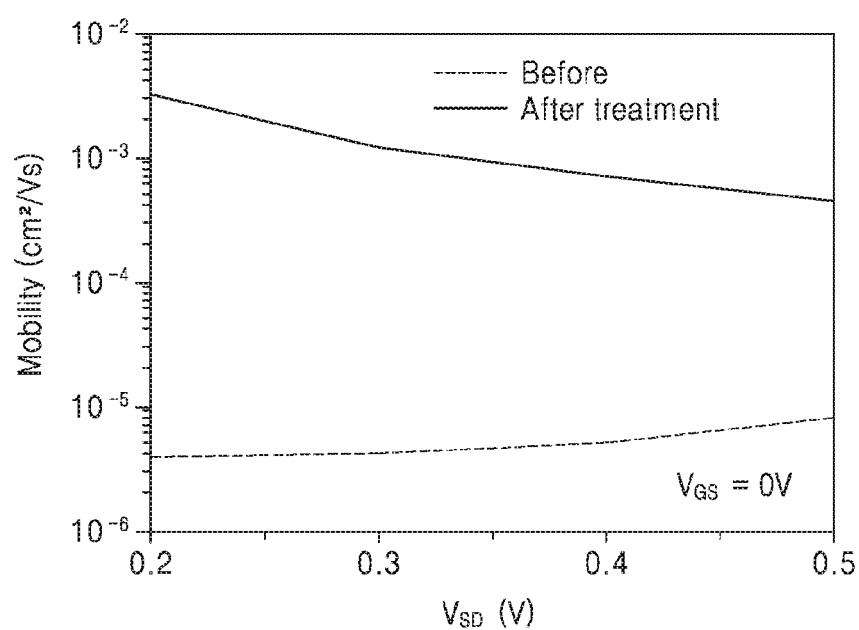

FIGS. 18A and 18B are graphs showing changes in mobility (cm/Vs) of semiconductor devices before and after a solution treatment versus voltages between sources and drains of the semiconductor devices. FIG. 18A illustrates a case where a drain-source voltage $V_{DS}$ is greater than 0V, and FIG. 18B illustrates a case where a source-drain voltage $V_{SD}$ is greater than 0V. In FIGS. 18A and 18B, a gate voltage VGS was 0V.

Referring to FIGS. 18A and 18B, an electron mobility of the semiconductor device after a solution treatment was increased by at most about 20 times (FIG. 18A) and at most about 500 times (FIG. 18B) the electron mobility of the semiconductor device before a solution treatment.

Figure 19:
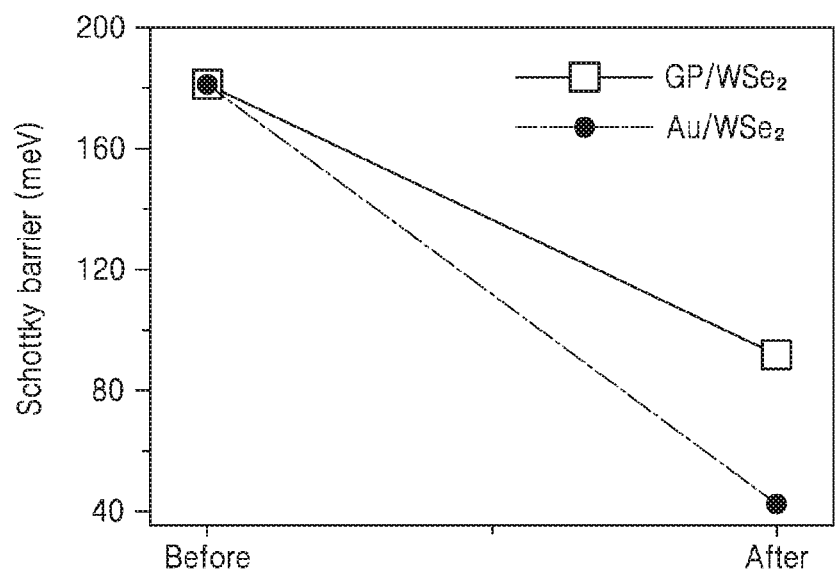
FIG. 19 is a graph showing a variation in a Schottky barrier between graphene (GP) and a WSe2 layer and a variation in a Schottky barrier between a metal layer (Au) and a WSe2 layer in semiconductor devices before and after a solution treatment.

FIG. 19 is a graph showing a variation in a Schottky barrier between graphene (GP) and a $WSe_2$ layer and a variation in a Schottky barrier between a metal layer (Au) and a $WSe_2$ layer in the semiconductor devices before and after a solution treatment.

Referring to FIG. 19, the Schottky barrier between the graphene (GP) and the $WSe_2$ layer was reduced from about 179 meV to about 90 meV, and the Schottky barrier between the metal layer (Au) and the $WSe_2$ layer was reduced from about 179 meV to about 42 meV.

Figure 20A:
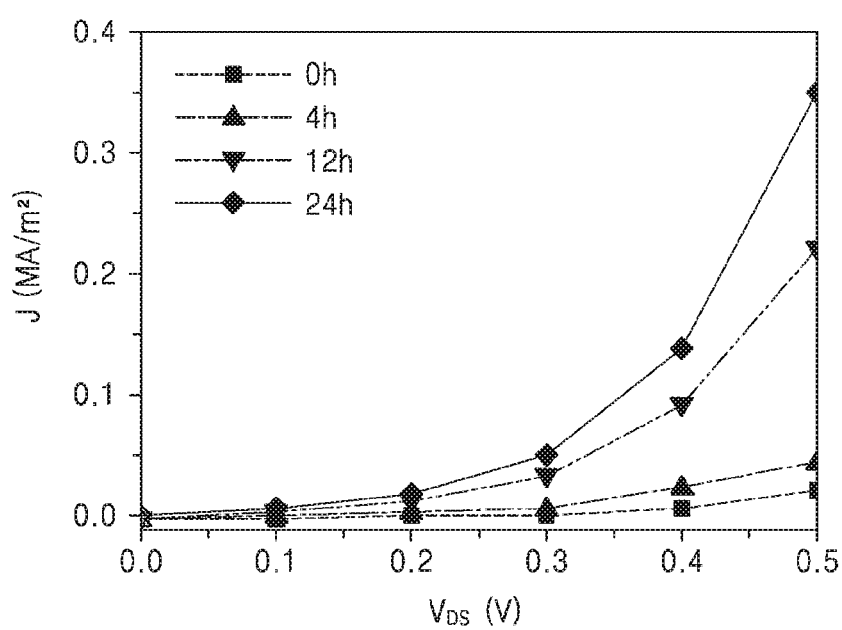
FIGS. 20A and 20B are graphs showing a variation in a current density J of a semiconductor device versus a voltage between a source and a drain of the semiconductor device according to a variation in a solution treatment time period.
Figure 20B:
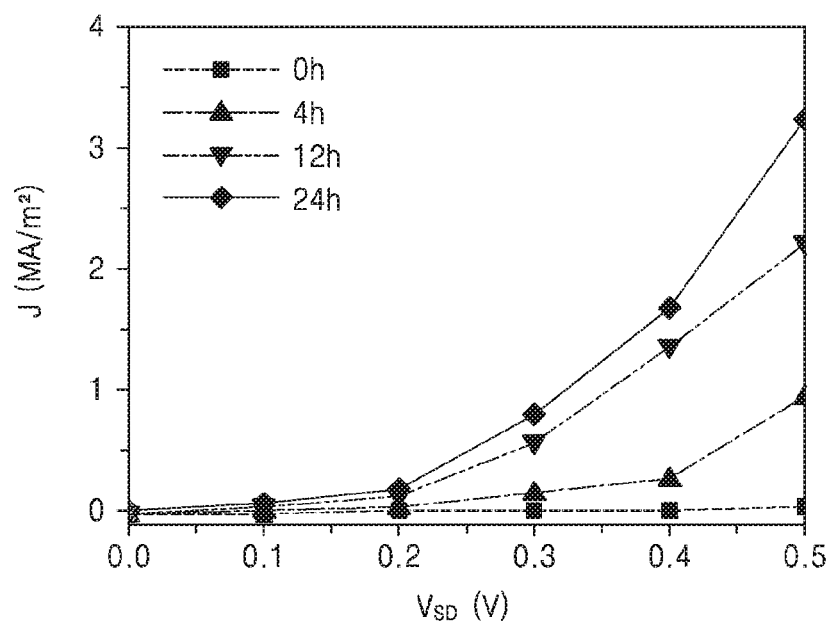

FIGS. 20A and 20B are graphs showing a variation in a current density J of a semiconductor device versus a voltage between a source and a drain of the semiconductor device according to a variation in a solution treatment time period. FIG. 20A illustrates a case where a drain-source voltage VDS is greater than 0V, and FIG. 20B illustrates a case where a source-drain voltage VSD is greater than 0V. While the solution treatment time period is changing to 0 h (not treated), 4 h, 12 h, and 24 h (where h denotes a time period), a variation in the current density was measured.

Referring to FIGS. 20A and 20B, as the solution treatment time period increases, the current density of the semiconductor device increases. As the drain-source voltage $V_{DS}$ of FIG. 20A or the source-drain voltage $V_{SD}$ of FIG. 20B increases, an increase range of the current density according to the solution treatment time period tends to increase.

Figure 21:
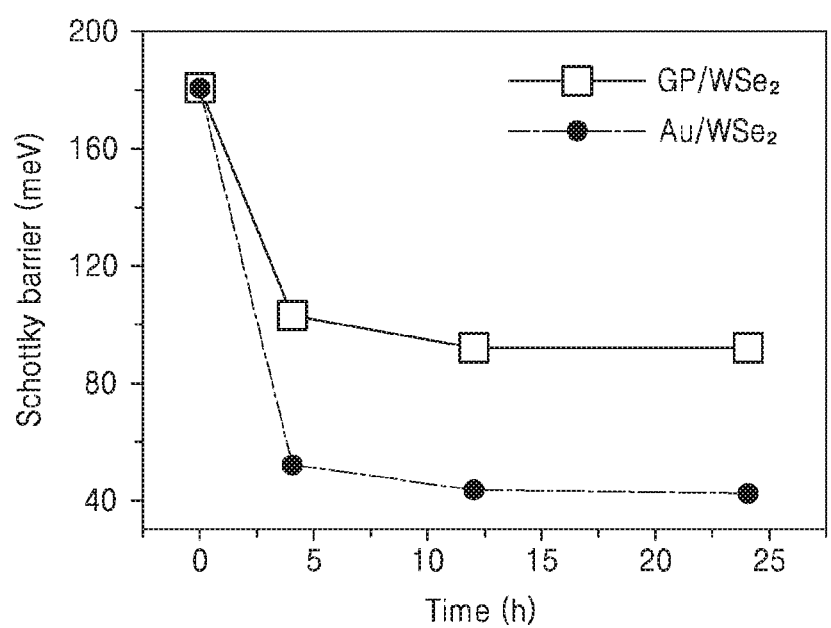
FIG. 21 is a graph showing a variation in a Schottky barrier between graphene (GP) and a $WSe_2$ layer and a variation in a Schottky barrier between a metal layer (Au) and a $WSe_2$ layer versus a solution treatment time period.

FIG. 21 is a graph showing a variation in a Schottky barrier between graphene (GP) and a $WSe_2$ layer and a variation in a Schottky barrier between a metal layer (Au) and a $WSe_2$ layer versus a solution treatment time period.

Referring to FIG. 21, as the solution treatment time period increases, the Schottky barrier between the graphene (GP) and the $WSe_2$ layer and the Schottky barrier between the metal layer (Au) and the $WSe_2$ layer decrease. The Schottky barrier between the graphene (GP) and the $WSe_2$ layer was reduced more greatly than the Schottky barrier between the metal layer (Au) and the $WSe_2$ layer. After a certain period of time has lapsed, the Schottky barriers may not greatly change.

Table 1 below shows a variation in characteristics of a semiconductor device according to some example embodiments according to a solution treatment time period.

TABLE 1

| Treatment time | J ($MA/m^2$) [$V_{DS}$ = 0.5 V] | J ($MA/m^2$) [$V_{SD}$ = 0.5 V] | Schottky barrier (meV) [GP/$WSe_2$] | Schottky barrier (meV) [Au/$WSe_2$] |
| --- | --- | --- | --- | --- |
| 0 hour | 0.021 | 0.023 | 179.6 | 179.0 |
| 4 hour | 0.044 | 0.950 | 102.0 | 51.8 |
| 12 hour | 0.221 | 2.292 | 91.1 | 43.0 |
| 24 hour | 0.350 | 3.22 | 90.9 | 42.0 |

As shown in Table 1, as the solution treatment time period increases, the current density J of the semiconductor device greatly increases, and the height of a Schottky barrier between layers considerably decreases.

The above-described results of FIGS. 16A-21 and Table 1 may be obtained as a semiconductor layer of a semiconductor device is changed like the semiconductor layer 300A or 300B of FIG. 14C or FIG. 15 by a solution treatment. In other words, because an intercalation material is inserted between layers of a 2D material of the semiconductor layer and/or the crystalline structure of the 2D material partially changes (e.g., 2H→1T or 1T'), mobility of the semiconductor layer in a vertical direction (thickness direction) may increase, electrical conductivity may increase, and the contact resistance and the Schottky barrier between the semiconductor layer and another material layer may decrease.

Accordingly, the performance and operational characteristics of the semiconductor device may improve. In particular, due to a 1T or 1T' phase region having a lower resistance than a 2H phase region and an intercalation material, a current loss may decrease, and mobility may increase. Due to the 1T or 1T' phase region and the intercalation material, the contact resistance and the Schottky barrier may be lowered at a bonding surface between the semiconductor layer and metal or graphene. In addition, because the crystalline structure of the entire region of the semiconductor layer is not changed but instead a partial region of the semiconductor layer is changed, a Fermi level of graphene is controlled by a gate voltage, thereby controlling the height and thickness of a channel barrier of the semiconductor layer.

When the semiconductor device according to some example embodiments is used as an optoelectronic device, the optoelectronic device may have a good performance and good operational characteristics, such as improved EQE, a high responsivity, and a high operation speed. For example, because carriers generated by light may fast move to both side electrodes and a light loss generated at a contact portion may decrease, improved EQE may be secured. The optoelectronic device may be a photodetector or a photovoltaic device, such as a solar cell. The optoelectronic device may be a luminous device, such as a semiconductor laser device or an LED. The optoelectronic device may have not only a 2-terminal structure but also a 3-terminal structure including a third electrode (e.g., a gate electrode). In addition, due to a hot-carrier generated in a region having the second crystalline structure (1T or 1T' phase), an optical device having an increased optical band may be realized. For example, an optical device having an optical band expanded up to an infrared (IR) region may be realized. When the semiconductor device according to some example embodiments is used as a transistor, a transistor having a high mobility, a low contact resistance, and good operational characteristics may be realized. The semiconductor device according to some example embodiments may be used as a low power device having a high current density even at a low input voltage, and is favorably applicable to realize a high-density integrated circuit.

Figure 22:
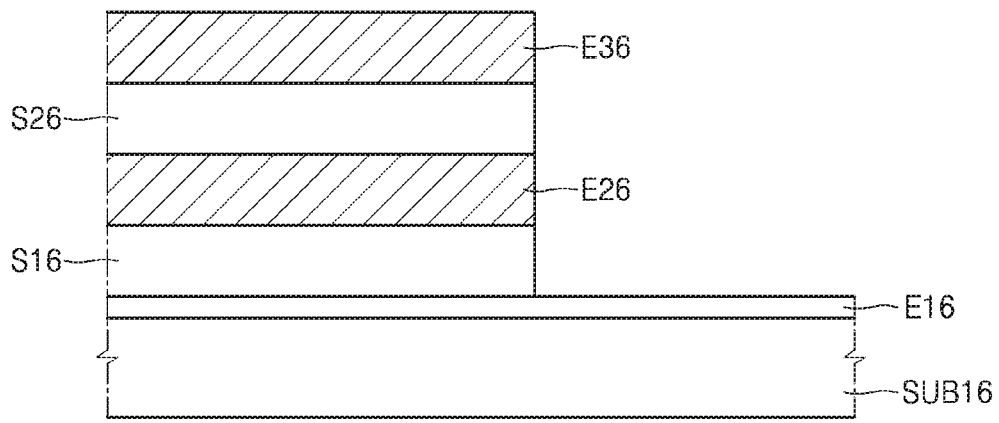
FIG. 22 is a cross-sectional view of a semiconductor device including a 2D material, according to some example embodiments.

FIG. 22 is a cross-sectional view of a semiconductor device including a 2D material, according to some example embodiments.

Referring to FIG. 22, a first conductive layer E16 may be formed on a substrate SUB16, and a first semiconductor layer S16 and a second conductive layer E26 may be sequentially formed on the first conductive layer E16. A second semiconductor layer S26 and a third conductive layer E36 may be further formed on the second conductive layer E26. Accordingly, the first semiconductor layer S16 may be between the first conductive layer E16 and the second conductive layer E26, and the second semiconductor layer S26 may be between the second conductive layer E26 and the third conductive layer E36. At least one of the first through third conductive layers E16, E26, and E36 may include graphene or may include a metallic material, such as metal or a metal compound.

At least one of the first and second semiconductor layers S16 and S26 may correspond to the semiconductor layer S10 of FIG. 1 or the semiconductor layer S20 of FIG. 2. In other words, the first and second semiconductor layers S16 and S26 may include a 2D material and an intercalation material disposed between layers of the 2D material. The 2D material of the first and second semiconductor layers S16 and S26 may include a first region having a first crystalline structure, and a second region having a second crystalline structure that is different from the first crystalline structure.

In some example embodiments, when the number of conductive layers (electrodes) E16, E26, and E36 is n, the number of semiconductor layers S16 and S26 may be n−1. Although not shown in FIG. 22, an additional semiconductor layer and an additional conductive layer may be alternately stacked on the third conductive layer E36 at least one time. As such, the semiconductor device may be constructed using the plurality of semiconductor layers S16 and S26. In this case, the plurality of semiconductor layers S16 and S26 may represent the same characteristics, or at least two of the plurality of semiconductor layers S16 and S26 may represent different characteristics. For example, the plurality of semiconductor layers S16 and S26 may be formed of different materials, may have different bandgaps, or may be doped with different dopants (p-type or n-type).

Figure 23:
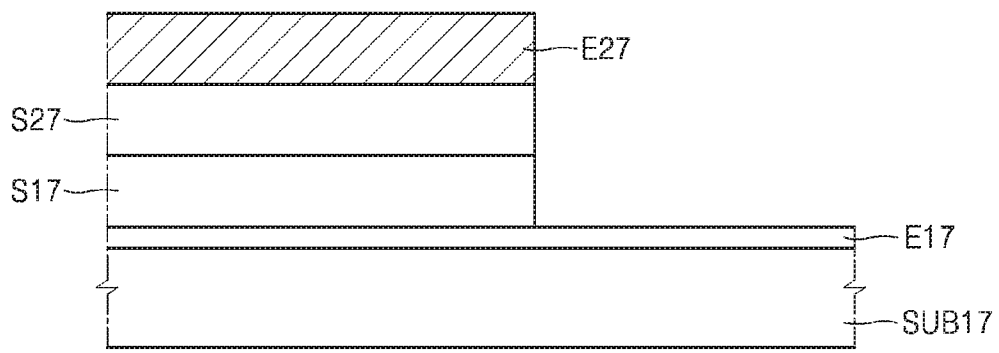
FIG. 23 is a cross-sectional view of a semiconductor device including a 2D material, according to some example embodiments.

FIG. 23 is a cross-sectional view of a semiconductor device including a 2D material, according to some example embodiments.

Referring to FIG. 23, a first conductive layer E17 may be formed on a substrate SUB17, a first semiconductor layer S17 and a second semiconductor layer S27 may be sequentially formed on the first conductive layer E17, and a second conductive layer E27 may be formed on the second semiconductor layer S27. Accordingly, the plurality of semiconductor layers S17 and S27 may be between the first conductive layer E17 and the second conductive layer E27 in a multi-layered structure. At least one of the first and second semiconductor layers S17 and S27 may correspond to the semiconductor layer S10 of FIG. 1 or the semiconductor layer S20 of FIG. 2. At least one of the first and second conductive layers E17 and E27 may include graphene or may include a metallic material, such as metal or a metal compound.

In some example embodiments, one of the first and second semiconductor layers S17 and S27 may be doped with a p-type dopant, and the other may be doped with an n-type dopant. In this case, the first and second semiconductor layers S17 and S27 may form a PN junction. Alternatively, one of the first and second semiconductor layers S17 and S27 may have a first bandgap, and the other of the first and second semiconductor layers S17 and S27 may have a second bandgap that is different from the first bandgap. Alternatively, the first and second semiconductor layers S17 and S27 may be formed of different materials and/or include different materials. By controlling the characteristics of the first semiconductor layer S17 and the second semiconductor layer S27, built-in potential between the first and second semiconductor layers S17 and S27 may be controlled.

In some cases, three or more semiconductor layers may be between the first and second conductive layers E17 and E27. An example is illustrated in FIG. 24.

Figure 24:
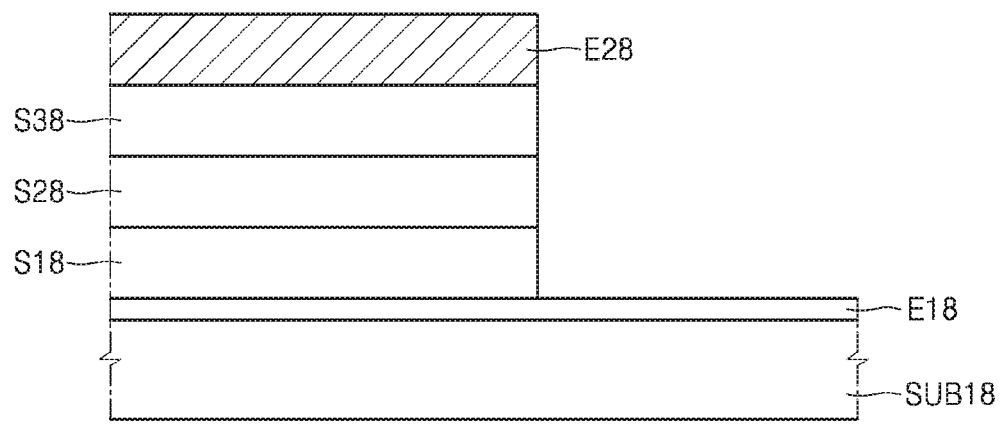
FIG. 24 is a cross-sectional view of a semiconductor device including a 2D material, according to some example embodiments.

Referring to FIG. 24, a first conductive layer E18 may be formed on a substrate SUB18, first through third semiconductor layers S18, S28, and S38 may be sequentially formed on the first conductive layer E18, and a second conductive layer E28 may be formed on the third semiconductor layer S38. At least one of the first through third semiconductor layers S18, S28, and S38 may correspond to the semiconductor layer S10 of FIG. 1 or the semiconductor layer S20 of FIG. 2. At least one of the first through third semiconductor layers S18, S28, and S38 may be doped with a p-type dopant, and the other may be doped with an n-type dopant. For example, the first and third semiconductor layers S18 and S38 may be doped with a p-type dopant (or an n-type dopant), and the second semiconductor layer S28 may be doped with an n-type dopant (or a p-type dopant). For example, in this case, the first through third semiconductor layers S18, S28, and S38 may form a PNP junction (or an NPN junction). At least two of the first through third semiconductor layers S18, S28, and S38 may have different band gaps or may be formed of different materials. Although not shown in FIG. 24, four or more semiconductor layers may be between the first and second conductive layers E18 and E28.

In FIGS. 22-24, a plurality of semiconductor layers are stacked in a vertical direction (e.g., a direction vertical to a substrate). However, according to some example embodiments, a plurality of semiconductor layers (or a plurality of semiconductor regions) may be stacked in a horizontal direction (e.g., a direction horizontal to the substrate). An example is illustrated in FIG. 25.

Figure 25:
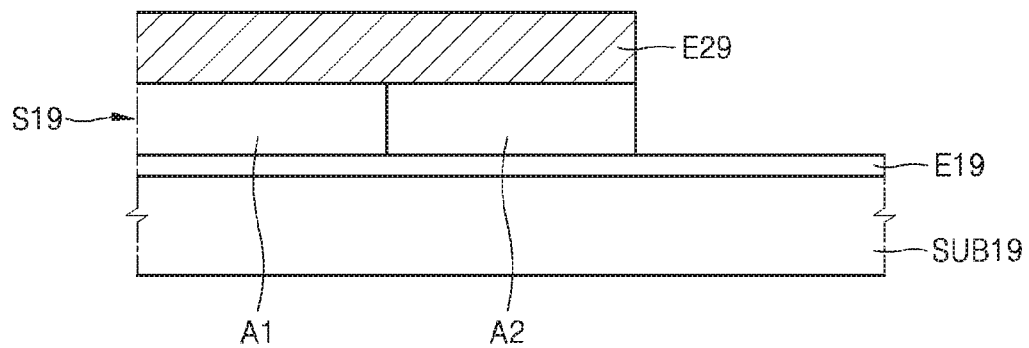
FIG. 25 is a cross-sectional view of a semiconductor device including a 2D material, according to some example embodiments.

Referring to FIG. 25, a first conductive layer E19 may be formed on a substrate SUB19, a semiconductor layer S19 may be formed on the first conductive layer E19, and a second conductive layer E29 may be formed on the semiconductor layer S19. At least a portion of the semiconductor layer S19 may correspond to the semiconductor layer S10 of FIG. 1 or the semiconductor layer S20 of FIG. 2. The semiconductor layer S19 may include a plurality of regions A1 and A2 arranged in the horizontal direction. For example, the semiconductor layer F19 may include a first semiconductor region A1 and a second semiconductor region A2 arranged in the horizontal direction. The first and second semiconductor regions A1 and A2 may have different characteristics. For example, the first and second semiconductor regions A1 and A2 may have different bandgaps, be doped with different dopants, or be formed of different materials. One of the first and second semiconductor regions A1 and A2 may be of a p-type and the other may be of an n-type. Although not shown in FIG. 25, the semiconductor layer S19 may include three or more regions arranged in the horizontal direction.

Each of the semiconductor devices of FIGS. 22-25 may further include a gate electrode. At least two of the structures of FIGS. 22-25 may be combined with each other. An array device may be obtained by arranging a plurality of devices of one of FIG. 1, FIG. 2, FIGS. 6-12, and FIGS. 22-25.

In addition, the semiconductor device according to some example embodiments may have a tandem structure. The semiconductor device according to some example embodiments may have an interdigitated electrode (IDE) structure in which electrodes alternate with each other. The semiconductor layer according to some example embodiments may be configured to use a semiconductor layer as a tunneling layer. In this case, the tunneling layer may have a thickness of, for example, about 10 nm or less, and accordingly, electrons or holes may move. The semiconductor device according to some example embodiments is applicable to general-use or complementary metal oxide semiconductor (CMOS) image sensors, charge coupled devices (CCDs), or photodetectors or photovoltaic devices of health monitoring devices, for example. Semiconductor devices according to example embodiments are applicable to various other devices.

While some example embodiments have been particularly shown and described, it should be understood that the embodiments should be considered in a descriptive sense only and not for purposes of limitation. For example, it will be understood by one of ordinary skill in the art that various changes in form and details may be made in the structures of the semiconductor devices of FIG. 1, FIG. 2, FIGS. 6-12, and FIGS. 22-25 without departing from the spirit and scope of the following claims. In detail, the first crystalline structures of FIG. 2 and the like may be crystalline structures other than the 2H phase, and the second crystalline structures of FIG. 2 and the like may be crystalline structures other than the 1T or 1T' phase. The semiconductor layer may include a 2D material other than the TMD material. A distribution and a range of the second region of the semiconductor layer that has the second crystalline structure may vary. The intercalation material may be a material other than Li and K, for example, another alkali material, such as Na. The method of manufacturing the semiconductor device, described above with reference to FIGS. 14A-14C and 15, may vary, and semiconductor devices according to embodiments are applicable to transistors, optoelectronic devices, and various devices to which the transistors and the optoelectronic devices are applied. Therefore, the scope of the inventive concepts is defined not by the embodiments described herein but by the appended claims.

What is claimed is:

1. A semiconductor device comprising:
   a semiconductor layer including a stack of a plurality of lavers of a two-dimensional (2D) material, and an intercalation material between the plurality of layers of the 2D material;
   a first conductive layer on a first surface of the semiconductor layer; and
   a second conductive layer on a second surface of the semiconductor layer, the second surface being opposite the first surface.

2. The semiconductor device of claim 1, wherein the 2D material includes a metal chalcogenide-based material.

3. The semiconductor device of claim 2, wherein the 2D material includes a transition metal dichalcogenide (TMD) material.

4. The semiconductor device of claim 1, wherein
   a first portion of the 2D material has a first crystalline structure, and
   a second portion of the 2D material has a second crystalline structure that is different from the first crystalline structure.

5. The semiconductor device of claim 4, wherein
   the first crystalline structure includes a 2H phase, and
   the second crystalline structure includes at least one of a 1T phase and a 1T' phase.

6. The semiconductor device of claim 4, wherein a region having the second crystalline structure within the 2D material has a higher electric conductivity than a region having the first crystalline structure within the 2D material.

7. The semiconductor device of claim 1, wherein the intercalation material includes at least one of lithium (Li) and potassium (K).

8. The semiconductor device of claim 1, wherein at least one of the first and second conductive layers includes one of metal, metal compound, and graphene.

9. The semiconductor device of claim 1, wherein
   the first and second conductive layers include metal or metal compound, or
   the first and second conductive layers include graphene, or
   one of the first and second conductive layers includes metal or metal compound and an other of the first and second conductive layers includes graphene.

10. The semiconductor device of claim 1, wherein the semiconductor layer has a thickness of 1 nm to several hundreds of μm.

11. The semiconductor device of claim 1, wherein a width of the semiconductor layer is, in a range of several um to several hundreds of μm.

12. The semiconductor device of claim 1, wherein
    the semiconductor layer is an undoped layer, or
    the semiconductor layer includes one of a p-type dopant and an n-type dopant.

13. The semiconductor device of claim 1, further comprising:
    a gate electrode apart from the semiconductor layer; and
    a gate insulation layer between the semiconductor layer and the gate electrode, wherein the gate insulation layer is connected to the gate electrode and the semiconductor layer.

14. The semiconductor device of claim 13, wherein
    the gate insulation layer is on a surface of the gate electrode, and
    the first conductive layer, the semiconductor layer, and the second conductive layer are sequentially stacked on a surface of the gate insulation layer.

15. The semiconductor device of claim 1, wherein the semiconductor device is a transistor.

16. The semiconductor device of claim 1, wherein the semiconductor device is an optoelectronic device.

17. A method of manufacturing a semiconductor device including first and second conductive layers respectively connected to opposite surfaces of a semiconductor layer, the method comprising:
    providing a device unit including the semiconductor layer, the semiconductor layer including a stack of a plurality of layers of a 2D material; and
    processing the device unit with a solution including an intercalation material, the processing the device unit including inserting the intercalation material between the plurality of layers of the 2D material.

18. The method of claim 17, wherein the providing the device unit includes:
    forming the first conductive layer;
    forming the semiconductor layer on the first conductive layer; and
    forming the second conductive layer on the semiconductor layer.

19. The method of claim 17, wherein the solution includes at least one of n-butyllithium, Cert-butyllithium, methyllithium, and a potassium hexalluorophosphate solution.

20. The method of claim 17, wherein
    the 2D material has a first crystalline structure before the intercalation material is inserted between the plurality of layers of the 2D material, and
    the inserting the intercalation material between the plurality of lavers of the 2D material includes changing a crystalline structure of a portion of the 2D) material to a second crystalline structure.

21. The method of claim 20, wherein
    the first crystalline structure includes a 2H phase, and
    the second crystalline structure includes at least one of a 1T phase and a 1T' phase.

22. The method of claim 17, wherein the 2D material includes a transition metal dichalcogenide (TMD) material.

23. The method of claim 17, wherein at least one of the first and second conductive layers includes one of metal, metal compound, and graphene.

24. The method of claim 17, further comprising:
forming a gate electrode spaced apart from the semiconductor layer.

* * * * *